(12) United States Patent
Asano et al.

(10) Patent No.: US 9,146,466 B2
(45) Date of Patent: Sep. 29, 2015

(54) RESIST COMPOSITION, RESIST PATTERN-FORMING METHOD, AND RESIST SOLVENT

(71) Applicant: JSR CORPORATION, Tokyo (JP)

(72) Inventors: Yusuke Asano, Tokyo (JP); Shin-ichi Nakamura, Tokyo (JP); Tomonori Futai, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 14/247,449

(22) Filed: Apr. 8, 2014

(65) Prior Publication Data

US 2014/0302438 A1    Oct. 9, 2014

(30) Foreign Application Priority Data

Apr. 8, 2013   (JP) .................................. 2013-080864

(51) Int. Cl.
G03F 7/039    (2006.01)
G03F 7/004    (2006.01)
G03F 7/038    (2006.01)

(52) U.S. Cl.
CPC .............. *G03F 7/038* (2013.01); *G03F 7/0048* (2013.01); *G03F 7/039* (2013.01)

(58) Field of Classification Search
CPC ..... G03F 7/004; G03F 7/0045; G03F 7/0048; G03F 7/039; G03F 7/0392; G03F 7/20
USPC .............................................. 430/270.1, 326
See application file for complete search history.

(56) References Cited

U.S. PATENT DOCUMENTS

| | | | |
|---|---|---|---|
| 6,479,211 B1 * | 11/2002 | Sato et al. ................... | 430/270.1 |
| 2002/0012874 A1 * | 1/2002 | Namba ........................ | 430/270.1 |
| 2003/0166828 A1 * | 9/2003 | Cox et al. ...................... | 528/335 |
| 2006/0063102 A1 * | 3/2006 | Kubota et al. ............... | 430/270.1 |
| 2009/0081589 A1 * | 3/2009 | Toukhy et al. .............. | 430/286.1 |
| 2012/0237873 A1 * | 9/2012 | Fujiwara et al. ............ | 430/280.1 |
| 2012/0328799 A1 * | 12/2012 | Liu et al. ....................... | 428/1.6 |

FOREIGN PATENT DOCUMENTS

| | | |
|---|---|---|
| EP | 0159428 | 10/1985 |
| JP | 6-12452 B2 | 5/1984 |
| JP | 59-93448 | 5/1984 |
| JP | 7-261377 | 10/1995 |
| JP | 10-123700 | * 5/1998 |
| JP | 2002-268206 | 9/2002 |
| JP | 2006-227632 | 8/2006 |
| WO | WO 2005/069076 | 7/2005 |
| WO | WO 2006/035790 | 4/2006 |
| WO | WO 2011/078106 | * 6/2011 |

OTHER PUBLICATIONS

Machine translation of JP 10-123700, published on May 15, 1998.*

* cited by examiner

*Primary Examiner* — Anca Eoff
(74) *Attorney, Agent, or Firm* — Oblon, McClelland, Maier & Neustadt, L.L.P.

(57) ABSTRACT

A resist composition includes a polymer that includes an acid-labile group-containing structural unit, a photoacid generator, and a solvent. The solvent includes a compound that includes a ketonic carbonyl group and an alcoholic hydroxyl group. The alcoholic hydroxyl group is preferably a tertiary alcoholic hydroxyl group. The solvent preferably further includes an alkylene glycol monoalkyl ether carboxylate.

7 Claims, No Drawings

RESIST COMPOSITION, RESIST PATTERN-FORMING METHOD, AND RESIST SOLVENT

CROSS-REFERENCE TO RELATED APPLICATIONS

The present application claims priority under 35 U.S.C. §119 to Japanese Patent Application No. 2013-080864, filed Apr. 8, 2013. The contents of this application are incorporated herein by reference in their entirety.

BACKGROUND OF THE INVENTION

1. Field of the Invention

The invention relates to a resist composition, a resist pattern-forming method, and a resist solvent.

2. Discussion of the Background

A reduction in dimensions of a resist pattern used for a lithographic process has been desired along with miniaturization of various electronic device (e.g., semiconductor device and liquid crystal device) structures, and various resist compositions have been studied. A resist composition is normally designed so that an acid is generated in the exposed area upon application of exposure light (e.g., deep ultraviolet rays (e.g., ArF excimer laser light) or electron beams), and a difference in dissolution rate in a developer occurs between the exposed area and the unexposed area due to the catalytic effect of the acid. A resist pattern is formed on a substrate utilizing the difference in dissolution rate.

The resist composition is required to exhibit excellent resolution and the like, and produce a highly accurate pattern with high process stability. Therefore, the resist composition is required to exhibit excellent lithographic performance (e.g., line width roughness (LWR) performance and critical dimension uniformity (CDU) performance), produce a resist pattern that shows only a small number of defects, exhibit excellent applicability (e.g., halation, peeling, repelling, and the like rarely occur when the resist composition is applied to a silicon film or the like, and the resist composition can be applied in only a small amount), and exhibit excellent storage stability (e.g., a foreign substance does not occur, and the sensitivity can be maintained even when the resist composition is stored for a long time), for example.

In order to satisfy the above requirements, each component of the resist composition, and various solvents used for the resist composition have been studied (see Japanese Patent Application Publication (KOKAI) No. 7-261377 and Japanese Patent Application Publication (KOKAI) No. 2002-268206).

SUMMARY OF THE INVENTION

According to one aspect of the present invention, a resist composition includes a polymer, a photoacid generator, and a solvent. The polymer includes an acid-labile group-containing structural unit. The solvent includes a compound that includes a ketonic carbonyl group and an alcoholic hydroxyl group.

According to another aspect of the present invention, a resist pattern-forming method includes forming a resist film using the resist composition. The resist film is exposed. The exposed resist film is developed.

According to further aspect of the present invention, a resist solvent includes a compound that includes a ketonic carbonyl group and an alcoholic hydroxyl group.

DESCRIPTION OF THE EMBODIMENTS

The resist composition and the resist pattern-forming method according to the embodiments of the invention can form a resist pattern that exhibits excellent applicability, excellent storage stability, excellent LWR performance, excellent CDU performance, and an excellent defect suppression capability. The resist composition according to the embodiment of the invention exhibits an applicability appropriate for a large substrate such as a wafer having a diameter of 450 mm.

A resist composition that includes the resist solvent according to the embodiment of the invention exhibits improved LWR performance, CDU performance, defect suppression capability, applicability, and storage stability. A resist composition that includes the resist solvent exhibits excellent applicability even when applying the resist composition to a large substrate such as a wafer having a diameter of 450 mm.

Therefore, the resist composition, the resist pattern-forming method, and the resist solvent may suitably be used for the production of semiconductor devices that are expected to be further miniaturized in the future.

Resist Composition

The resist composition (hereinafter may be referred to as "resist composition (A)") includes the polymer that includes an acid-labile group-containing structural unit (hereinafter may be referred to as "polymer [A]"), the photoacid generator (hereinafter may be referred to as "acid generator [B]"), and the solvent (hereinafter may be referred to as "solvent [S]"), the solvent [S] including the compound that includes a ketonic carbonyl group and an alcoholic hydroxyl group (hereinafter may be referred to as "compound (I)"). When the solvent [S] includes the compound (I), the resist composition (A) exhibits excellent LWR performance, excellent CDU performance, an excellent defect suppression capability, excellent applicability, and excellent storage stability.

Note that the acid generator [B] included in the resist composition may be included in the structural unit included in the polymer [A]. The resist composition may further include an acid diffusion controller [C], a fluorine atom-containing polymer [D] (hereinafter may be referred to as "polymer [D]"), and the like as long as the advantageous effects of the invention are not impaired. Each component is described below.

Solvent [S]

The solvent [S] includes the compound (I). When the solvent [S] includes the compound (I), the resist composition exhibits excellent LWR performance, excellent CDU performance, an excellent defect suppression capability, excellent applicability, and excellent storage stability. The solvent [S] included in the resist composition (A) may include only one type of the compound (I), or may include two or more types of the compound (I). The solvent [S] may further include a compound other than the compound (I) (hereinafter may be referred to as "compound (II)") as long as the advantageous effects of the invention are not impaired.

The compound (I) and the compound (II) are described below.

Compound (I)

The compound (I) is a compound that includes a ketonic carbonyl group and an alcoholic hydroxyl group. The term "ketonic carbonyl group" used herein refers to a carbonyl group (C=O) in which two carbon atoms are bonded to the carbon atom. The term "alcoholic hydroxyl group" used herein refers to a hydroxyl group (OH) that is bonded to a carbon atom that does not form an aromatic ring.

The reasons that the above effects are achieved when the resist composition (A) includes the solvent [S] that includes the compound (I) have not necessarily been clarified. It is conjectured that, when a ketonic carbonyl group and an alcoholic hydroxyl group are present in a single molecule, each component (particularly the acid generator) included in the resist composition is stabilized (i.e., decomposition thereof is suppressed) while achieving high solubility due to the synergistic effects of the ketonic carbonyl group and the alcoholic hydroxyl group, and formation of a foreign substance is suppressed, for example.

The compound (I) is not particularly limited as long as the compound (I) includes both a ketonic carbonyl group and an alcoholic hydroxyl group.

The compound (I) may include an additional functional group (e.g., ether group) in addition to a ketonic carbonyl group and an alcoholic hydroxyl group. It is preferable that the compound (I) does not include such an additional functional group.

The compound (I) may include only one ketonic carbonyl group, or may include two or more ketonic carbonyl groups. It is preferable that the compound (I) include only one ketonic carbonyl group.

The compound (I) may include only one alcoholic hydroxyl group, or may include two or more alcoholic hydroxyl groups. It is preferable that the compound (I) include only one alcoholic hydroxyl group.

The alcoholic hydroxyl group included in the compound (I) may be a primary alcoholic hydroxyl group (i.e., a hydroxyl group that is bonded to a primary carbon atom), a secondary alcoholic hydroxyl group (i.e., a hydroxyl group that is bonded to a secondary carbon atom), or a tertiary alcoholic hydroxyl group (i.e., a hydroxyl group that is bonded to a tertiary carbon atom). The alcoholic hydroxyl group is preferably a secondary alcoholic hydroxyl group or a tertiary alcoholic hydroxyl group, and more preferably a tertiary alcoholic hydroxyl group.

It is preferable that the alcoholic hydroxyl group included in the compound (I) be bonded at the α-position, the β-position, or the γ-position with respect to the ketonic carbonyl group. It is more preferable that the alcoholic hydroxyl group be bonded at the α-position or the β-position (still more preferably the β-position) with respect to the ketonic carbonyl group.

It is considered that the above stabilization effect is improved when the compound (I) has the above structure to improve the LWR performance, the CDU performance, the defect suppression capability, the applicability, and the storage stability of the resist composition (A).

The number of carbon atoms of the compound (I) is preferably 3 to 20, more preferably 3 to 10, and still more preferably 4 to 8, from the viewpoint of further improving the solubility of the compound (I).

A compound represented by the following formula (1-1) is preferable as the compound that includes one ketonic carbonyl group and one alcoholic hydroxyl group.

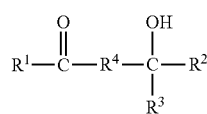
(1-1)

wherein $R^1$ is a monovalent hydrocarbon group having 1 to 10 carbon atoms, $R^2$ and $R^3$ are independently a hydrogen atom or a monovalent hydrocarbon group having 1 to 10 carbon atoms, and $R^4$ is a single bond or a divalent hydrocarbon group having 1 to 10 carbon atoms, provided that two or more of $R^1$ to $R^4$ optionally bond to each other to form a cyclic structure together with the carbon atom(s) bonded thereto.

Examples of the monovalent hydrocarbon group having 1 to 10 carbon atoms represented by $R^1$ to $R^3$ include chain-like hydrocarbon groups such as linear or branched alkyl groups having 1 to 10 carbon atoms such as a methyl group, an ethyl group, an n-propyl group, an i-propyl group, an n-butyl group, an i-butyl group, an sec-butyl group, and a t-butyl group, linear or branched alkenyl groups having 2 to 10 carbon atoms such as an ethenyl group, a propenyl group, and a butenyl group, and linear or branched alkynyl groups having 2 to 10 carbon atoms such as an ethynyl group, a propynyl group, and a butynyl group; alicyclic hydrocarbon groups such as cycloalkyl groups having 3 to 10 carbon atoms such as a cyclopropyl group, a cyclobutyl group, a cyclopentyl group, a cyclohexyl group, a norbornyl group, and an adamantyl group, and cycloalkenyl groups having 3 to 10 carbon atoms such as a cyclopropenyl group, a cyclobutenyl group, a cyclopentenyl group, a cyclohexenyl group, and a norbornenyl group; aromatic hydrocarbon groups such as aryl groups having 6 to 10 carbon atoms such as a phenyl group, a tolyl group, a xylyl group, and a naphthyl group, and aralkyl groups having 7 to 10 carbon atoms such as a benzyl group, a phenethyl group, and a phenylpropyl group; and the like.

Examples of the divalent hydrocarbon group having 1 to 10 carbon atoms represented by $R^4$ include groups obtained by eliminating one hydrogen atom from the groups mentioned above in connection with $R^1$ to $R^3$, and the like.

Examples of the cyclic structure formed by two or more of $R^1$ to $R^4$ together with the carbon atom(s) bonded thereto include alicyclic structures such as a cyclopropane structure, a cyclobutane structure, a cyclopentane structure, and a cyclohexane structure, and the like.

$R^1$ is preferably a chain-like hydrocarbon group or an alicyclic hydrocarbon group, more preferably an alkyl group or a cycloalkyl group, still more preferably an alkyl group having 1 to 4 carbon atoms, yet more preferably a methyl group or an ethyl group, and particularly preferably a methyl group.

$R^2$ and $R^3$ are preferably a hydrogen atom or a chain-like hydrocarbon group, more preferably a hydrogen atom or an alkyl group, still more preferably a hydrogen atom or an alkyl group having 1 to 4 carbon atoms, yet more preferably a hydrogen atom, a methyl group, or an ethyl group, and particularly preferably a hydrogen atom or a methyl group. It is preferable that at least one of $R^2$ and $R^3$ be a hydrocarbon group. It is more preferable that both $R^2$ and $R^3$ be a hydrocarbon group.

$R^4$ is preferably a single bond or a chain-like hydrocarbon group, more preferably a single bond or an alkanediyl group, still more preferably an alkanediyl group having 1 to 5 carbon atoms, yet more preferably an alkylidene group having 1 to 5 carbon atoms, and particularly preferably a methanediyl group.

Examples of the compound (I) include aliphatic ketoalcohols such as 4-hydroxy-4-methyl-2-pentanone (diacetone alcohol), 4-hydroxy-2-pentanone, 4-hydroxy-2-butanone, 5-hydroxy-5-methyl-3-hexanone, 5-hydroxy-3-hexanone, 5-hydroxy-3-pentanone, 4-hydroxy-4-ethyl-2-hexanone, and 4-hydroxy-2-hexanone; alicyclic ketoalcohols such as 3-hydroxy-1-cyclohexyl-3-methyl-1-butanone, 3-hydroxy-1-cyclohexyl-1-butanone, and 3-hydroxy-1-cyclohexyl-3-propanon; aromatic alcohols such as 3-hydroxy-1-phenyl-3-methyl-1-butanone, 3-hydroxy-1-phenyl-1-butanone, and 3-hydroxy-1-phenyl-3-propanon; and the like.

The compound (I) is preferably a ketoalcohol that includes a tertiary alcoholic hydroxyl group, more preferably an aliphatic ketoalcohol having 4 to 10 carbon atoms, still more preferably an aliphatic ketoalcohol having 6 to 10 carbon atoms that includes a tertiary alcoholic hydroxyl group at the β-position with respect to the ketonic carbonyl group, and particularly preferably diacetone alcohol.

Compound (II)

The solvent [S] included in the resist composition (A) may include the compound (II) other than the compound (I) as long as the advantageous effects of the invention are not impaired.

Examples of the compound (II) include alcohol compounds (excluding alcohol compounds that fall under the compound (I)), ether compounds, ketone compounds (excluding ketone compounds that fall under the compound (I)), amide compounds, ester compounds, hydrocarbon compounds, and the like.

Examples of the alcohol compounds include monohydric alcohol compounds such as methanol, ethanol, n-propanol, isopropanol, n-butanol, isobutanol, sec-butanol, n-pentanol, isopentanol, 2-methylbutanol, sec-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, and benzyl alcohol; polyhydric alcohol compounds such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, and tripropylene glycol; polyhydric alcohol partial ether compounds such as alkylene glycol monoalkyl ether compounds such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethyl butyl ether, propylene glycol monomethyl ether, propylene glycol monoethyl ether, propylene glycol monopropyl ether, and propylene glycol monobutyl ether, and ether group-containing alkylene glycol monoalkyl ether compounds such as diethylene glycol monomethyl ether, diethylene glycol monoethyl ether, diethylene glycol monopropyl ether, diethylene glycol monobutyl ether, diethylene glycol monohexyl ether, dipropylene glycol monomethyl ether, dipropylene glycol monoethyl ether, and dipropylene glycol monopropyl ether; and the like.

Examples of the ether compounds include dialkyl ether compounds such as diethyl ether, dipropyl ether, and dibutyl ether; cyclic ether compounds such as tetrahydrofuran and tetrahydropyran; aromatic ring-containing ether compounds such as diphenyl ether and anisole (methyl phenyl ether); and the like.

Examples of the ketone compounds include chain-like ketone compounds such as acetone, methyl ethyl ketone, methyl n-propyl ketone, methyl n-butyl ketone, diethyl ketone, methyl isobutyl ketone, 2-heptanone (methyl n-pentyl ketone), ethyl n-butyl ketone, methyl n-hexyl ketone, diisobutyl ketone, and trimethylnonanone; cyclic ketone compounds such as cyclopentanone, cyclohexanone, cycloheptanone, cyclooctanone, and methylcyclohexanone; 2,4-pentanedione; acetonylacetone; acetophenone; and the like.

Examples of the amide compounds include cyclic amide compounds such as N,N'-dimethylimidazolidinone and N-methylpyrrolidone; chain-like amide compounds such as N-methylformamide, N,N-dimethylformamide, N,N-diethylformamide, acetamide, N-methylacetamide, N,N-dimethylacetamide, and N-methylpropionamide; and the like.

Examples of the ester compounds include acetate compounds such as methyl acetate, ethyl acetate, n-propyl acetate, isopropyl acetate, n-butyl acetate, isobutyl acetate, sec-butyl acetate, n-pentyl acetate, isopentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, and n-nonyl acetate; polyhydric alcohol partial ether carboxylate compounds such as alkylene glycol monoalkyl ether carboxylate compounds such as ethylene glycol monomethyl ether acetate, ethylene glycol monoethyl ether acetate, propylene glycol monomethyl ether acetate, propylene glycol monoethyl ether acetate, propylene glycol monopropyl ether acetate, propylene glycol monobutyl ether acetate, and propylene glycol monomethyl ether propionate, and ether group-containing alkylene glycol monoalkyl ether carboxylate compounds such as diethylene glycol monomethyl ether acetate, diethylene glycol monoethyl ether acetate, diethylene glycol mono-n-butyl ether acetate, dipropylene glycol monomethyl ether acetate, dipropylene glycol monoethyl ether acetate, and dipropylene glycol monomethyl ether propionate; lactone compounds such as γ-butyrolactone and valerolactone; carbonate compounds such as diethyl carbonate, ethylene carbonate, and propylene carbonate; glycol diacetate; methoxy triglycol acetate; ethyl propionate; n-butyl propionate; isoamyl propionate; diethyl oxalate; di-n-butyl oxalate; methyl acetoacetate; ethyl acetoacetate; methyl lactate; ethyl lactate; n-butyl lactate; n-amyl lactate; diethyl malonate; dimethyl phthalate; diethyl phthalate; and the like.

Examples of the hydrocarbon compounds include aliphatic hydrocarbon compounds such as n-pentane, isopentane, n-hexane, isohexane, n-heptane, isoheptane, 2,2,4-trimethylpentane, n-octane, isooctane, cyclohexane, and methylcyclohexane; aromatic hydrocarbon compounds such as benzene, toluene, xylene, mesitylene, ethylbenzene, trimethylbenzene, methylethylbenzene, n-propylbenzene, isopropylbenzene, diethylbenzene, isobutylbenzene, triethylbenzene, diisopropylbenzene, and n-amylnaphthalene; and the like.

The compound (II) is preferably an ester compound, more preferably a polyhydric alcohol partial ether carboxylate compound or a lactone compound, still more preferably an alkylene glycol monoalkyl ether carboxylate compound or a monocyclic lactone compound, yet more preferably a propylene glycol monoalkyl ether carboxylate or a 5-membered or 6-membered lactone, and particularly preferably propylene glycol monomethyl ether acetate or γ-butyrolactone.

The lower limit of the content of the compound (I) in the solvent [S] is preferably 1 mass %, more preferably 7 mass %, still more preferably 12 mass %, and particularly preferably 15 mass %. The upper limit of the content of the compound (I) in the solvent [S] is preferably 100 mass %, more preferably 70 mass %, still more preferably 50 mass %, and particularly preferably 35 mass %. When the content of the compound (I) in the solvent [S] is within the above range, the LWR performance, the CDU performance, the defect suppression capability, the applicability, and the storage stability of the resist composition can be further improved.

Polymer [A]

The polymer [A] includes an acid-labile group-containing structural unit (hereinafter may be referred to as "structural unit (I)"). The term "acid-labile group" used herein refers to a group that substitutes the hydrogen atom of a carboxyl group, a phenolic hydroxyl group, or the like, and dissociates due to an acid. When the resist composition includes the polymer [A], the acid generator [B], and the solvent [S] it is possible to form a resist pattern having a good shape.

The polymer [A] is not particularly limited as long as the polymer [A] includes the structural unit (I). It is preferable that the polymer [A] further include a structural unit (II) that includes at least one structure selected from the group consisting of a lactone structure, a cyclic carbonate structure, and a sultone structure, in addition to the structural unit (I). The polymer [A] may also include a hydroxyl group-containing structural unit (III) and the like.

Each structural unit is described below.

Structural Unit (I)

The structural unit (I) includes the acid-dissociable group. The structural unit (I) is not particularly limited as long as the structural unit (I) includes the acid-dissociable group. Examples of the structural unit (I) include a structural unit having a structure obtained by substituting the hydrogen atom of a carboxyl group with an acid-labile group, a structural unit having a structure obtained by substituting the hydrogen atom of a phenolic hydroxyl group with an acid-labile group, and the like. The structural unit (I) is preferably a structural unit represented by the following formula (2).

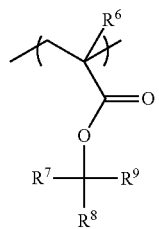
(2)

wherein $R^6$ is a hydrogen atom, a fluorine atom, a methyl group, or a trifluoromethyl group, $R^7$ is a monovalent chain-like hydrocarbon group having 1 to 10 carbon atoms, or a monovalent alicyclic hydrocarbon group having 3 to 20 carbon atoms, and $R^8$ and $R^9$ are independently a monovalent chain-like hydrocarbon group having 1 to 10 carbon atoms, or a monovalent alicyclic hydrocarbon group having 3 to 20 carbon atoms, provided that $R^8$ and $R^9$ optionally bond to each other to form an alicyclic structure having 3 to 20 carbon atoms together with the carbon atom bonded to $R^8$ and $R^9$.

$R^6$ is preferably a hydrogen atom or a methyl group, and more preferably a methyl group, from the viewpoint of the copolymerizability of the monomer that produces the structural unit (II).

Examples of the monovalent chain-like hydrocarbon group having 1 to 10 carbon atoms represented by $R^7$, $R^8$, and $R^9$ include alkyl groups such as a methyl group, an ethyl group, an n-propyl group, and an i-propyl group; alkenyl groups such as an ethenyl group, a propenyl group, and a butenyl group; alkynyl groups such as an ethynyl group, a propynyl group, and a butyryl group; and the like.

Examples of the monovalent alicyclic hydrocarbon group having 3 to 20 carbon atoms represented by $R^7$, $R^8$, and $R^9$ include monocyclic cycloalkyl groups such as a cyclopentyl group and cyclohexyl group; monocyclic cycloalkenyl groups such as a cyclopentenyl group and a cyclohexenyl group; polycyclic cycloalkyl groups such as a norbornyl group, an adamantyl group, and a tricyclodecyl group; polycyclic cycloalkenyl groups such as a norbornenyl group and a tricyclodecenyl group; and the like.

Examples of the alicyclic structure having 3 to 20 carbon atoms formed by $R^8$ and $R^9$ together with the carbon atom bonded to $R^8$ and $R^9$ include monocyclic cycloalkane structure such as a cyclopropane structure, a cyclobutane structure, a cyclopentane structure, a cyclohexane structure, a cycloheptane structure, and a cyclooctane structure; polycyclic cycloalkane structure such as a norbornane structure, an adamantane structure, a tricyclodecane structure, and a tetracyclododecane structure; and the like.

The structural unit (I) is preferably a structural unit among structural units respectively represented by the following formulas (2-1) to (2-4) (hereinafter may be referred to as "structural units (I-1) to (I-4)").

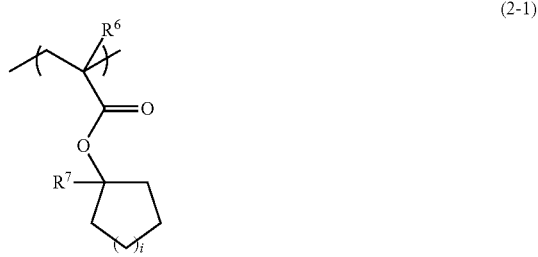
(2-1)

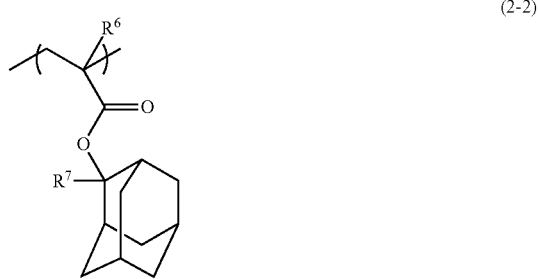
(2-2)

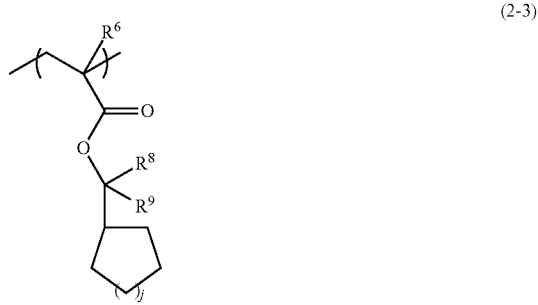
(2-3)

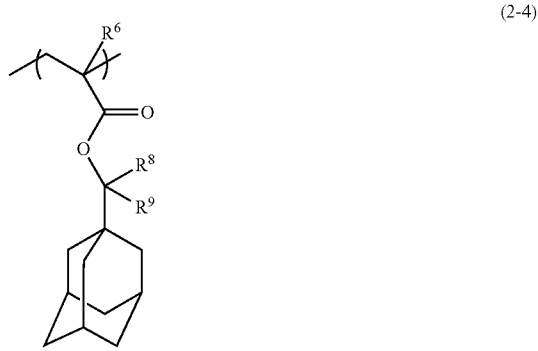
(2-4)

wherein $R^6$ to $R^9$ are the same as defined for the formula (2), and i and j are independently an integer from 1 to 4.

Examples of the structural unit (I) include structural units respectively represented by the following formulas, and the like.

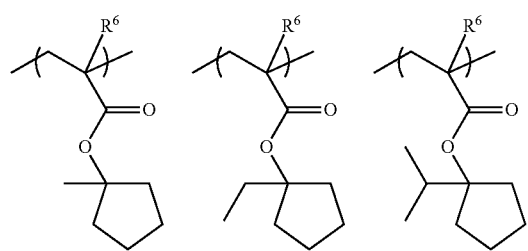
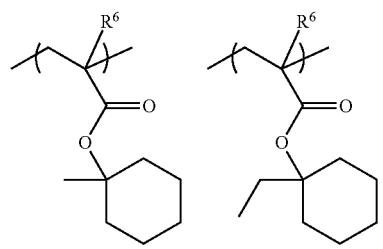
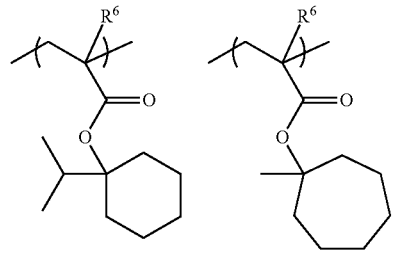
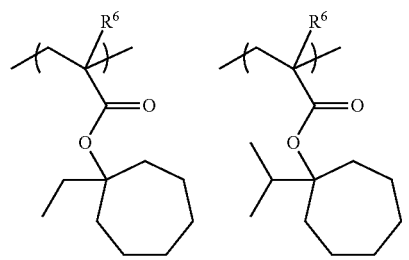
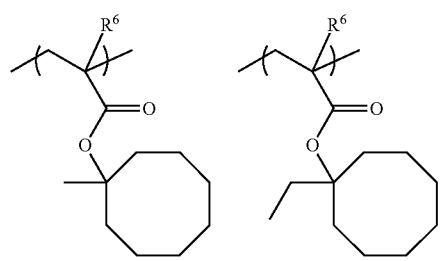
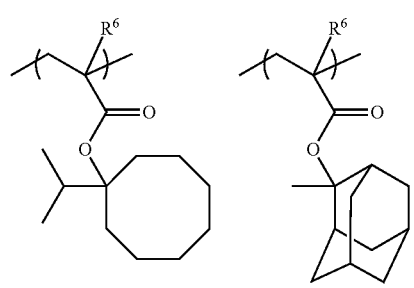

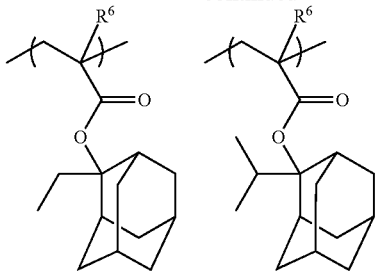
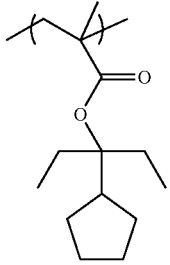
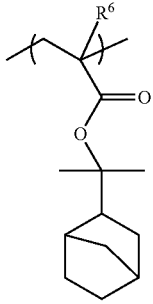
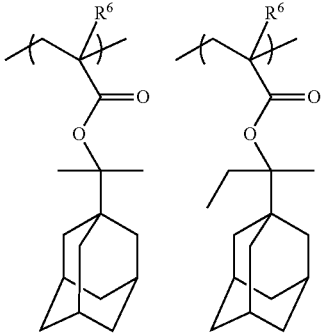
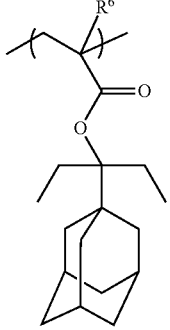

wherein $R^6$ is the same as defined for the formula (2).

The structural unit (I) is preferably a structural unit derived from a 1-alkyl-1-cyclopentyl (meth)acrylate, a structural unit derived from a 2-alkyl-2-adamantyl (meth)acrylate, a structural unit derived from 2-(adamantan-1-yl)propan-2-yl (meth)acrylate, or a structural unit derived from 2-cyclohexylpropan-2-yl (meth)acrylate.

The content of the structural unit (I) in the polymer [A] is preferably 10 to 80 mol %, more preferably 20 to 70 mol %, and still more preferably 30 to 65 mol %, based on the total structural units included in the polymer [A]. When the content of the structural unit (I) is within the above range, the sensitivity and the resolution of the resist composition are improved. As a result, the resist composition exhibits improved LWR performance, CDU performance, and defect suppression capability. If the content of the structural unit (I) is less than 10 mol %, the pattern-forming capability of the resist composition may deteriorate. If the content of the structural unit (I) exceeds 80 mol %, the resulting resist pattern may exhibit insufficient adhesion to a substrate.

Structural Unit (II)

The structural unit (II) is a structural unit that includes at least one structure selected from the group consisting of a lactone structure, a cyclic carbonate structure, and a sultone structure (excluding a structural unit that falls under the structural unit (I)). When the polymer [A] includes the structural unit (II) in addition to the structural unit (I), the solubility of the polymer [A] in a developer can be more advantageously adjusted. As a result, the resist composition exhibits improved LWR performance, CDU performance, and defect suppression capability. Moreover, a resist pattern formed using the resist composition exhibits improved adhesion to a substrate.

Examples of the structural unit (II) include structural units respectively represented by the following formulas, and the like.

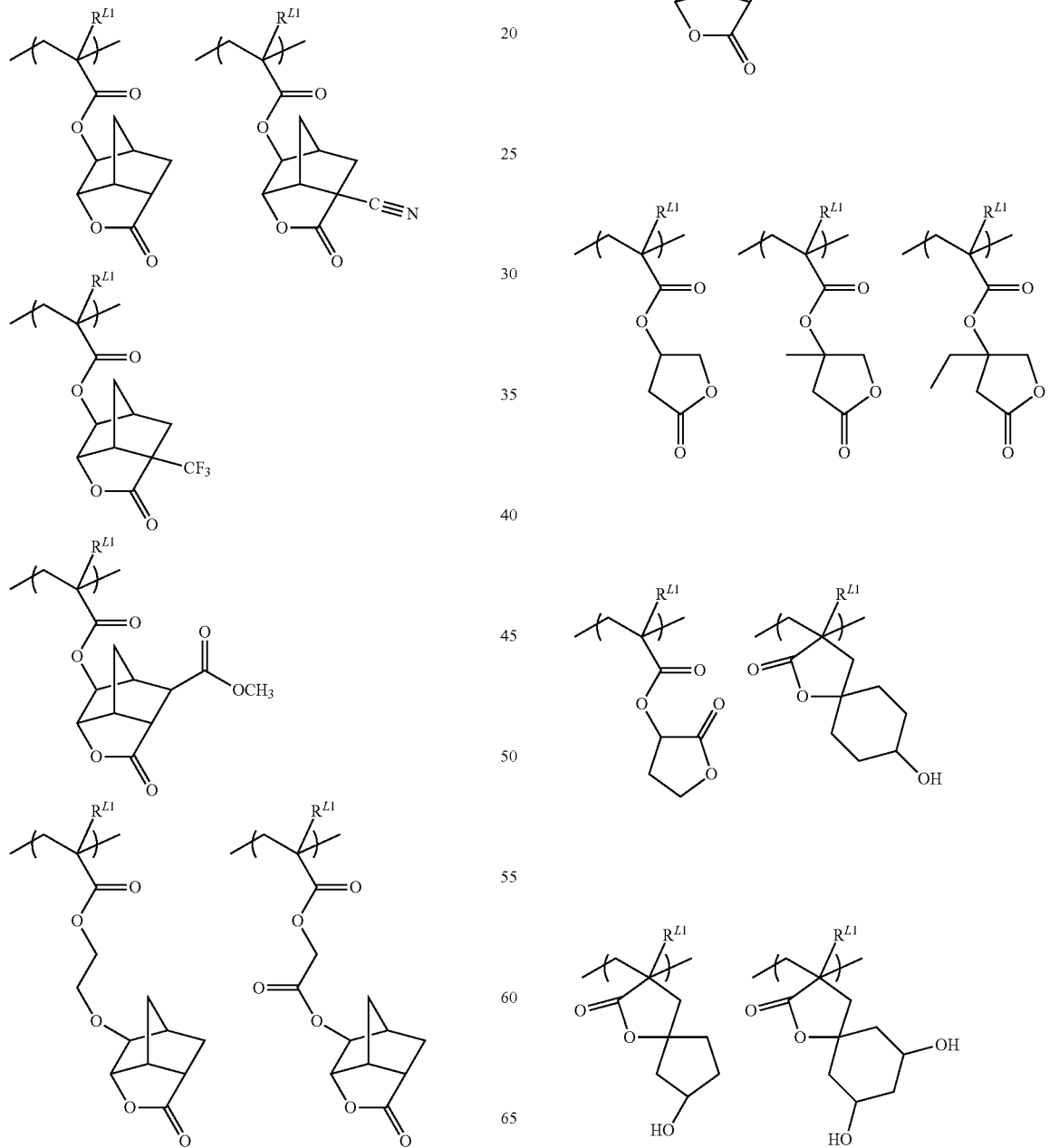

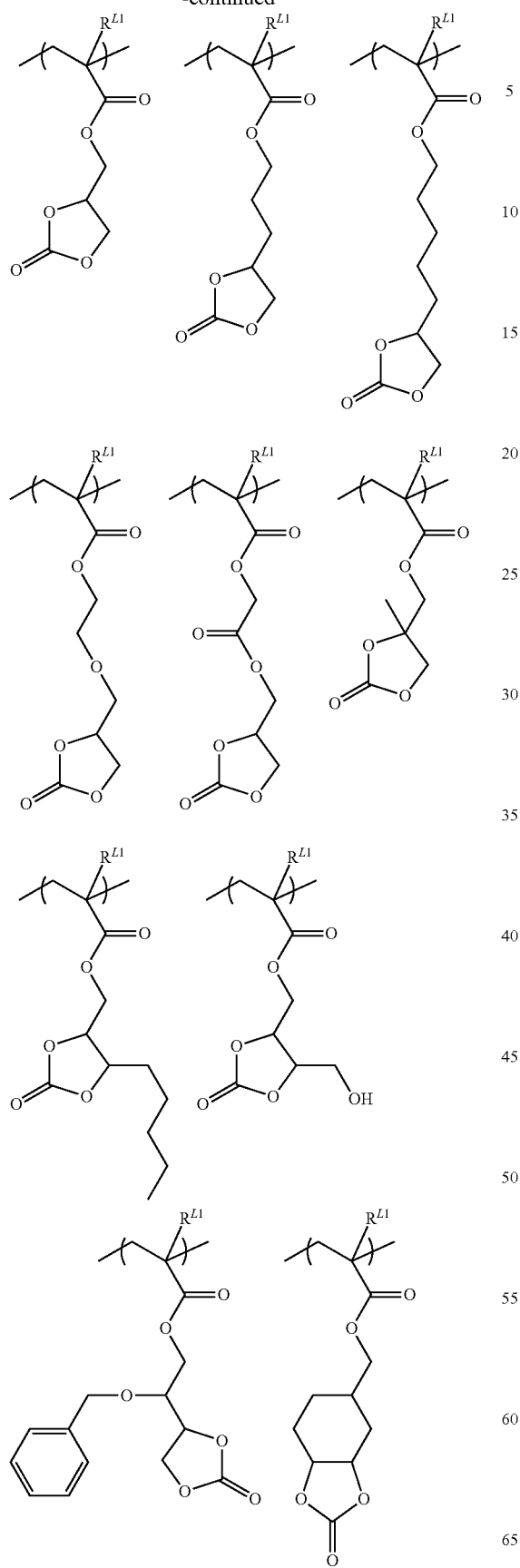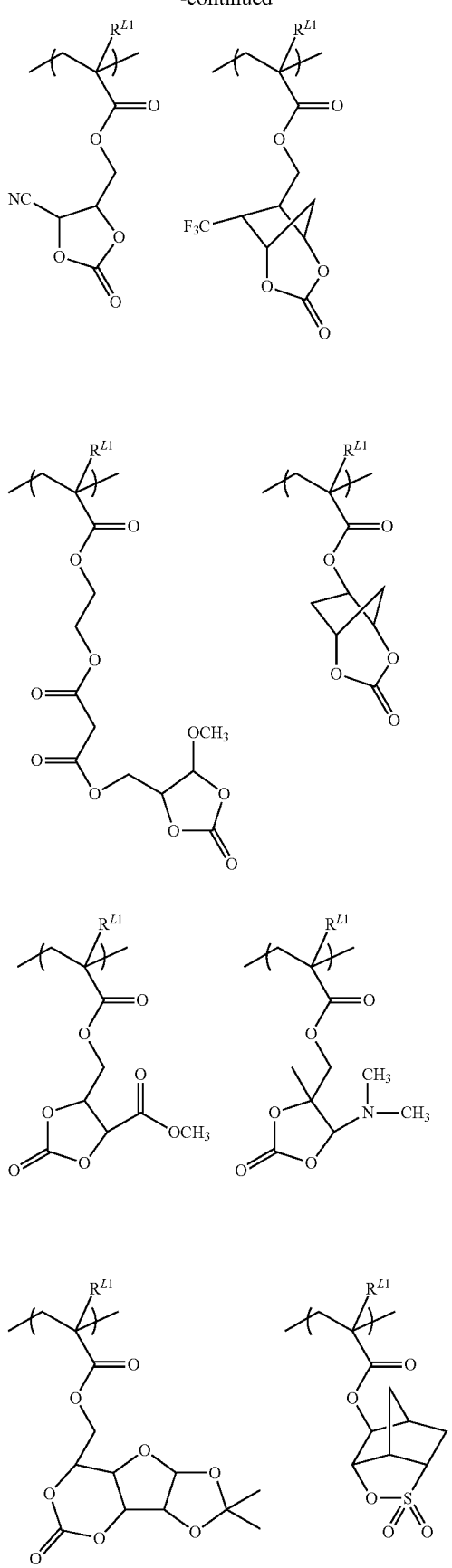

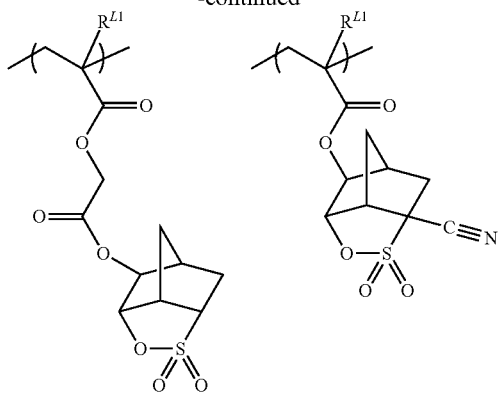
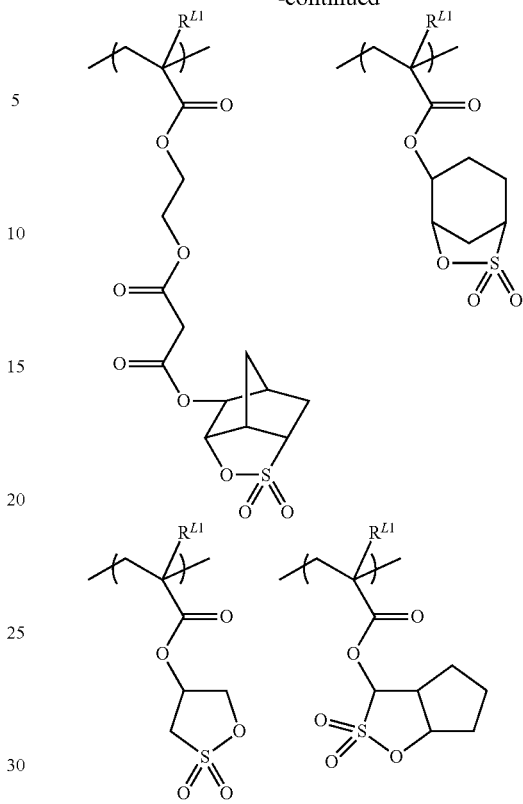
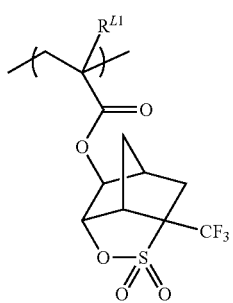
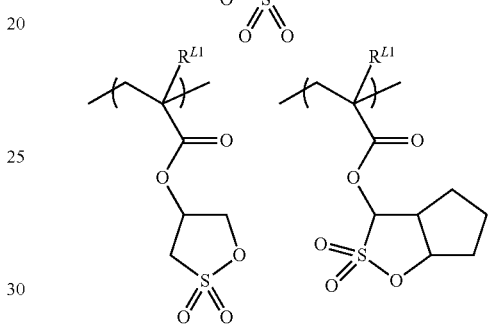
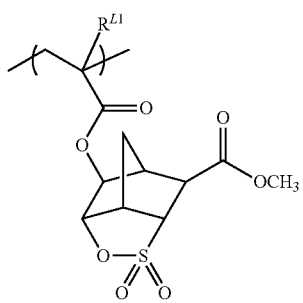
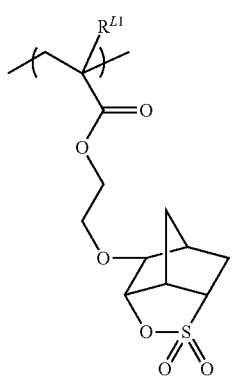

wherein $R^{L1}$ is a hydrogen atom, a fluorine atom, a methyl group, or a trifluoromethyl group.

The structural unit (II) is preferably a structural unit that includes a norbornanelactone structure, a structural unit that includes a γ-butyrolactone structure, a structural unit that includes an ethylene carbonate structure, or a structural unit that includes a norbornanesultone structure, and more preferably a structural unit derived from norbornanelactonyl (meth)acrylate, a structural unit derived from norbornanelactonyloxycarbonylmethyl (meth)acrylate, a structural unit derived from γ-butyrolactonyl (meth)acrylate, a structural unit derived from ethylenecarbonylmethyl (meth)acrylate, or a structural unit derived from norbornanesultonyloxycarbonylmethyl (meth)acrylate.

The content of the structural unit (II) in the polymer [A] is preferably 10 to 80 mol %, more preferably 25 to 70 mol %, and still more preferably 35 to 60 mol %, based on the total structural units included in the polymer [A]. When the content of the structural unit (II) is within the above range, a resist pattern formed using the resulting resist composition exhibits improved adhesion to a substrate. If the content of the structural unit (II) is less than 10 mol %, a resist pattern formed using the resulting resist composition may exhibit insufficient adhesion to a substrate. If the content of the structural unit (II) exceeds 80 mol %, the pattern-forming capability of the resist composition may deteriorate.

Structural Unit (III)

The structural unit (III) is a structural unit that includes a hydroxyl group. When the polymer [A] further includes the structural unit (III), the solubility of the polymer [A] in a developer can be more advantageously adjusted. As a result, the resist composition exhibits improved LWR performance, CDU performance, and defect suppression capability.

Examples of the structural unit (III) include structural units respectively represented by the following formulas, and the like.
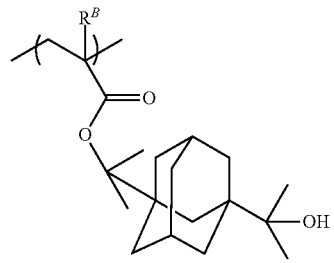
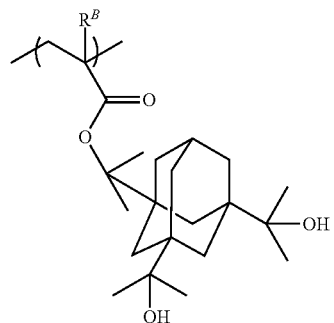
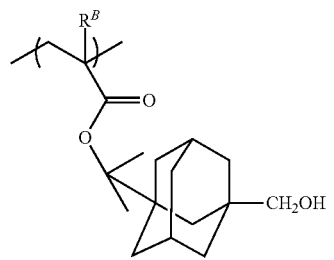
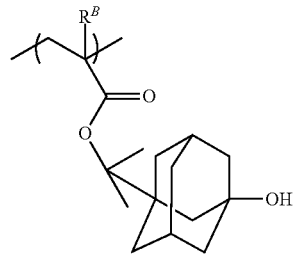
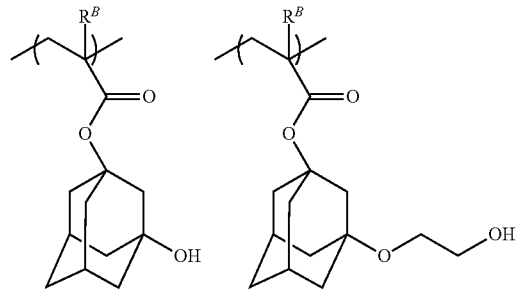
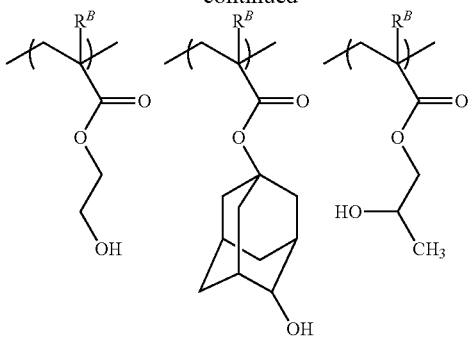
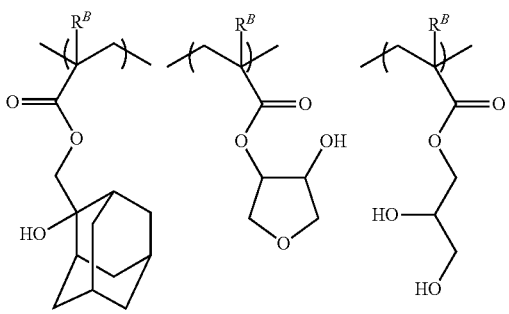
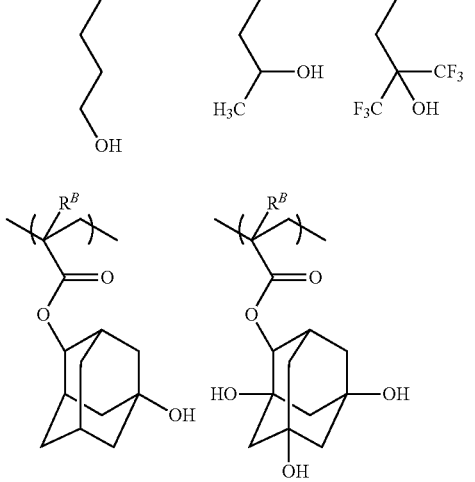
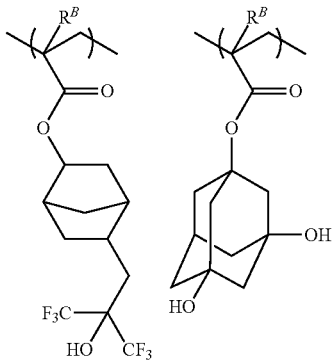

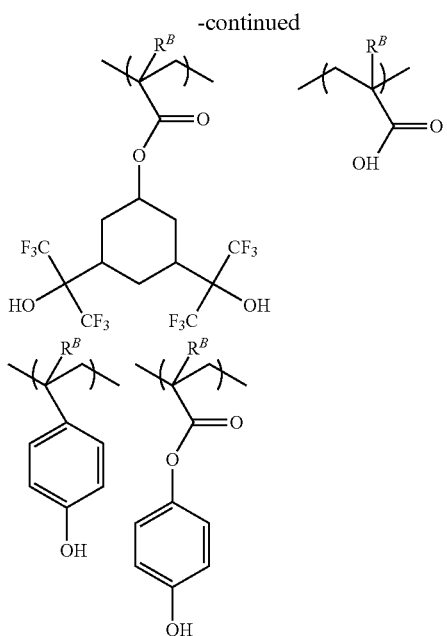

wherein $R^B$ is a hydrogen atom, a fluorine atom, a methyl group, or a trifluoromethyl group.

The structural unit (III) is preferably a structural unit derived from 3-hydroxyadamantan-1-yl (meth)acrylate.

The content of the structural unit (III) in the polymer [A] is preferably 30 mol % or less, more preferably 25 mol % or less, and still more preferably 5 to 25 mol %, based on the total structural units included in the polymer [A]. If the content of the structural unit (III) exceeds 30 mol %, the pattern-forming capability of the resist composition may deteriorate.

Additional Structural Unit

The polymer [A] may include an additional structural unit other than the structural units (I) to (III). Examples of the additional structural unit include a structural unit that includes a polar group (e.g., carboxyl group, cyano group, or nitro group), a structural unit that includes a non-labile alicyclic hydrocarbon group, and the like.

The content of the additional structural unit in the polymer [A] is preferably 20 mol % or less, and more preferably 10 mol % or less.

The content of the polymer [A] in the resist composition (on a solid basis) is preferably 70 mol % or more, more preferably 80 mol % or more, and still more preferably 85 mol % or more.

Method for Synthesizing Polymer [A]

The polymer [A] may be synthesized by polymerizing a monomer that produces each structural unit in an appropriate solvent in the presence of a radical initiator or the like, for example.

Examples of the radical initiator include azo-based radical initiators such as azobisisobutyronitrile (AIBN), 2,2'-azobis (4-methoxy-2,4-dimethylvaleronitrile), 2,2'-azobis(2-cyclopropylpropionitrile), 2,2'-azobis(2,4-dimethylvaleronitrile), and dimethyl 2,2'-azobisisobutyrate; peroxide-based radical initiators such as benzoyl peroxide, t-butyl hydroperoxide, and cumene hydroperoxide; and the like. Among these, AIBN and dimethyl 2,2'-azobisisobutyrate are preferable, and AIBN is more preferable. These radical initiators may be used either alone or in combination.

Examples of the solvent used for polymerization include alkanes such as n-pentane, n-hexane, n-heptane, n-octane, n-nonane, and n-decane; cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutanes, bromohexanes, dichloroethanes, hexamethylene dibromide, and chlorobenzene; saturated carboxylates such as ethyl acetate, n-butyl acetate, i-butyl acetate, and methyl propionate; ketones such as acetone, methyl ethyl ketone, 4-methyl-2-pentanone, and 2-heptanone; ethers such as tetrahydrofuran, dimethoxyethane, and diethoxyethane; alcohols such as methanol, ethanol, 1-propanol, 2-propanol, and 4-methyl-2-pentanol; and the like. These solvents may be used for polymerization either alone or in combination.

The reaction (polymerization) temperature is normally 40 to 150° C., and preferably 50 to 120° C. The reaction (polymerization) time is normally 1 to 48 hours, and preferably 1 to 24 hours.

The polystyrene-reduced weight average molecular weight (Mw) of the polymer [A] determined by gel permeation chromatography (GPC) is not particularly limited, but is preferably 1000 to 50,000, more preferably 2000 to 30,000, still more preferably 3000 to 20,000, and particularly preferably 5000 to 15,000. When the Mw of the polymer [A] is within the above range, the resist composition exhibits improved applicability and an improved defect suppression capability.

The ratio (Mw/Mn) (hereinafter may be referred to as "dispersity") of the Mw to the polystyrene-reduced number average molecular weight (Mn) of the polymer [A] determined by GPC is normally 1 to 5, preferably 1 to 3, and more preferably 1 to 2.

The terms "Mw" and "Mn" used herein refer to values determined by gel permeation chromatography (GPC) under the following conditions.
GPC column: G2000HXL×2, G3000HXL×1, G4000HXL×1 (manufactured by Tosoh Corporation)
Column temperature: 40° C.
Eluant: tetrahydrofuran (manufactured by Wako Pure Chemical Industries, Ltd.)
Flow rate: 1.0 ml/min
Sample concentration: 1.0 mass %
Amount of sample introduced: 100 μL
Detector: differential refractometer
Standard: monodisperse polystyrene Acid Generator [B]

The acid generator [B] is a substance that generates an acid upon exposure. The acid-labile group included in the polymer [A] or the like dissociates due to the acid generated by the acid generator [B] to produce a carboxyl group or the like, and the polymer [A] changes in solubility in a developer. Therefore, a resist pattern can be formed using the resist composition. The acid generator [B] may be included in the photoresist composition in the form of a low-molecular-weight compound (described later) and/or an acid-generating group included in the polymer.

Examples of the acid generator [B] include onium salt compounds, N-sulfonyloxyimide compounds, halogen-containing compounds, diazoketone compounds, and the like.

Examples of the onium salt compounds include sulfonium salts, tetrahydrothiophenium salts, iodonium salts, phosphonium salts, diazonium salts, pyridinium salts, and the like.

Examples of the sulfonium salts include triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, triphenylsulfonium camphorsulfonate, triphenylsulfonium 2-(1-adamantyl)-1,1-difluoroethanesulfonate, 4-cyclohexylphenyldiphenylsulfonium trifluoromethanesulfonate, 4-cyclohexylphenyl-diphenylsulfonium nonafluoro-n-butanesulfonate, 4-cyclohexylphenyldiphenylsulfonium perfluoro-n-octanesulfonate, 4-cyclohexylphenyldiphenylsulfonium 2-bicyclo[2.2.1]hept-2-yl-1,1,2,2-tetrafluoroethanesulfonate, 4-cyclohexylphenyldiphenylsulfonium camphorsulfonate, 4-methanesulfonylphenyldiphenylsulfonium trifluoromethanesulfonate, 4-methanesulfonylphenyldiphenylsulfonium nonafluoro-n-butanesulfonate, 4-methanesulfonylphenyldiphenylsulfonium perfluoro-n-octanesulfonate, 4-methanesulfonylphenyldiphenylsulfonium 2-bicyclo[2.2.1]hept-2-yl-1,1,2,2-tetrafluoroethanesulfonate, 4-methanesulfonylphenyldiphenylsulfonium camphorsulfonate, triphenylsulfonium 1,1,2,2-tetrafluoro-6-(1-adamantanecarbonyloxy)hexane-1-sulfonate, and the like.

Examples of the tetrahydrothiophenium salts include 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesufonate, 1-(4-n-butoxynaphthalen-1-yl)tetrahydrothiophenium perfluoro-n-octanesulfonate, 1-(4-n-butoxynaphthalen-1-yl)tetrahydrothiophenium 2-bicyclo[2.2.1]hept-2-yl-1,1,2,2-tetrafluoroethanesulfonate, 1-(4-n-butoxynaphthalen-1-yl)tetrahydrothiophenium camphorsulfonate, 1-(6-n-butoxynaphthalen-2-yl)tetrahydrothiophenium trifluoromethanesulfonate, 1-(6-n-butoxynaphthalen-2-yl)tetrahydrothiophenium nonafluoro-n-butanesulfonate, 1-(6-n-butoxynaphthalen-2-yl)tetrahydrothiophenium perfluoro-n-octanesulfonate, 1-(6-n-butoxynaphthalen-2-yl)tetrahydrothiophenium 2-bicyclo[2.2.1]hept-2-yl-1,1,2,2-tetrafluoroethanesulfonate, 1-(6-n-butoxynaphthalen2-yl)tetrahydrothiophenium camphorsulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium 2-bicyclo[2.2.1]hept-2-yl-1,1,2,2-tetrafluoroethanesulfonate, 1-(3,5-dimethyl-4-hydroxyphenyl)tetrahydrothiophenium camphorsulfonate, and the like.

Examples of the iodonium salts include diphenyliodonium trifluoromethanesulfonate, diphenyliodonium nona fluoro-n-butanesufonate, diphenyliodonium perfluoro-n-octanesulfonate, diphenyliodonium 2-bicyclo[2.2.1]hept-2-yl-1,1,2,2-tetrafluoroethanesulfonate, diphenyliodonium camphorsulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, bis(4-t-butylphenyl)iodonium camphorsulfonate, and the like.

Examples of the N-sulfonyloxyimide compounds include N-(trifluoromethanesulfonyloxy)bicyclo[2.2.1]hept-5-ene-2,3-dicarboxyimide, N-(nonafluoro-n-butanesulfonyloxy)bicyclo[2.2.1]hept-5-ene-2,3-dicarboxyimide, N-(perfluoro-n-octanesulfonyloxy)bicyclo[2.2.1]hept-5-ene-2,3-dicarboxyimide, N-(2-bicyclo[2.2.1]hept-2-yl-1,1,2,2-tetrafluoroethanesulfonyloxy)bicyclo[2.2.1]hept-5-ene-2,3-dicarboxyimide, N-(2-(3-tetracyclo[4.4.0.1$^{2,5}$.1$^{7,10}$]dodecanyl)-1,1-difluoroethanesulfonyloxy)bicyclo[2.2.1]hept-5-ene-2,3-dicarboxyimide, N-(camphorsulfonyloxy)bicyclo[2.2.1]hept-5-ene-2,3-dicarboxyimide, and the like.

A compound represented by the following formula (3) is preferable as the acid generator [B]. It is conjectured that the diffusion length of the acid generated in the resist film upon exposure moderately decreases when the acid generator [B] has the following structure due to interaction with the structural unit (I) included in the polymer [A], and the like, and the LWR performance, the CDU performance, and the defect suppression capability of the resist composition are improved.

$$R^{10}-R^{11}-SO_3^- X^+ \qquad (3)$$

wherein $R^{10}$ is a monovalent group that includes an alicyclic structure having 7 or more ring atoms, or a monovalent group that includes an aliphatic heterocyclic structure having 7 or more ring atoms, $R^{11}$ is a fluorinated alkanediyl group having 1 to 10 carbon atoms, and $X^+$ is a monovalent photodegradable onium cation.

The term "ring atoms" used herein in connection with $R^{10}$ refers to the atoms that form the alicyclic structure (ring) or the aliphatic heterocyclic structure (ring). When $R^{10}$ includes a polyalicyclic structure (ring) or an aliphatic polyheterocyclic structure (ring), the term "ring atoms" refers to the atoms that form the polyalicyclic structure (ring) or the aliphatic polyheterocyclic structure (ring).

Examples of the monovalent group that includes an alicyclic structure having 7 or more ring atoms represented by $R^{10}$ include monocyclic cycloalkyl groups such as a cyclooctyl group, a cyclononyl group, a cyclodecyl group, and a cyclododecyl group; monocyclic cycloalkenyl groups such as a cyclooctenyl group and a cyclodecenyl group; polycyclic cycloalkyl groups such as a norbornyl group, an adamantyl group, a tricyclodecyl group, and a tetracyclododecyl group; polycyclic cycloalkenyl groups such as a norbornenyl group and a tricyclodecenyl group; and the like.

Examples of the monovalent group that includes an aliphatic heterocyclic structure having 7 or more ring atoms represented by $R^{10}$ include groups that include a lactone structure, such as a norbornanelactonyl group; groups that include a sultone structure, such as a norbornanesultonyl group; oxygen atom-containing heterocyclic groups such as an oxacycloheptyl group and an oxanorbornyl group; nitrogen atom-containing heterocyclic groups such as an azacycloheptyl group and a diazabicyclooctanyl group; sulfur atom-containing heterocyclic groups such as a thiacycloheptyl group and a thianorbornyl group; and the like.

The number of ring atoms of the group represented by $R^{10}$ is preferably 8 or more, more preferably 9 to 15, and still more preferably 10 to 13, in order to ensure that the acid has a more moderate diffusion length.

$R^{10}$ is preferably a monovalent group that includes an alicyclic structure having 9 or more ring atoms, or a monovalent group that includes an aliphatic heterocyclic structure having 9 or more ring atoms, more preferably an adamantyl group, a hydroxyadamantyl group, a norbornanelactonyl group, or a 5-oxo-4-oxatricyclo[4.3.1.1$^{3,8}$]undecanyl group, and still more preferably an adamantyl group.

Examples of the fluorinated alkanediyl group having 1 to 10 carbon atoms represented by $R^{11}$ include groups obtained by substituting one or more hydrogen atoms of an alkanediyl group having 1 to 10 carbon atoms (e.g., methanediyl group, ethanediyl group, or propanediyl group) with a fluorine atom, and the like.

$R^{11}$ is preferably a fluorinated alkanediyl group in which a fluorine atom is bonded to the carbon atom adjacent to the $SO_3^-$ group, more preferably a fluorinated alkanediyl group in which two fluorine atoms are bonded to the carbon atom adjacent to the $SO_3^-$ group, and still more preferably a 1,1-difluoromethanediyl group, a 1,1-difluoroethanediyl group, a 1,1,3,3,3-pentafluoro-1,2-propanediyl group, a 1,1,2,2-tetrafluoroethanediyl group, a 1,1,2,2-tetrafluorobutanediyl group, or a 1,1,2,2-tetrafluorohexanediyl group.

The monovalent photodegradable onium cation represented by $X^+$ is a cation that decomposes upon irradiation with exposure light. A sulfonic acid is produced in the exposed area from a proton produced by decomposition of the photodegradable onium cation, and the sulfonate anion. Examples of the monovalent photodegradable onium cation represented by $X^+$ include radiation-degradable onium cations that include S, I, O, N, P, Cl, Br, F, As, Se, Sn, Sb, Te, Bi, or the like. Examples of the cations that include S (sulfur) include a sulfonium cation, a tetrahydrothiophenium cation, and the like. Examples of the cations that include I (iodine) include an iodonium cation and the like. Among these, a sulfonium cation represented by the following formula (X-1), a tetrahydrothiophenium cation represented by the following formula (X-2), and an iodonium cation represented by the following formula (X-3) are preferable.

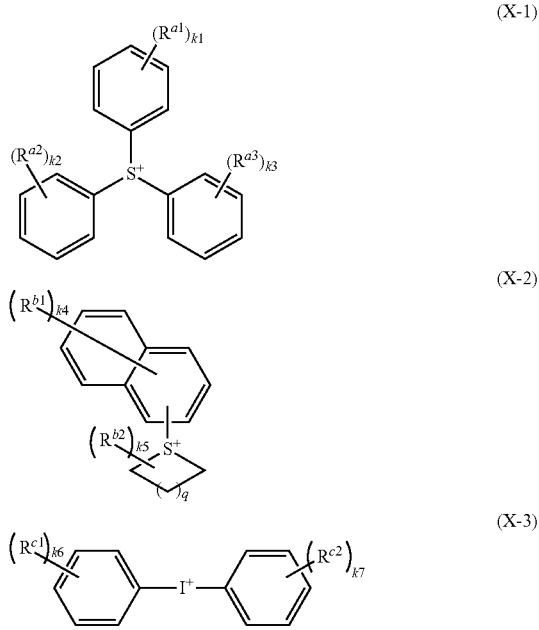

In the formula (X-1), $R^{a1}$, $R^{a2}$, and $R^{a3}$ are independently a substituted or unsubstituted linear or branched alkyl group having 1 to 12 carbon atoms, a substituted or unsubstituted aromatic hydrocarbon group having 6 to 12 carbon atoms, $-OSO_2-R^P$, or $-SO_2-R^Q$, provided that two or more groups among $R^{a1}$, $R^{a2}$, and $R^{a1}$ optionally bond to each other to form a cyclic structure, $R^P$ and $R^Q$ are independently a substituted or unsubstituted monovalent linear or branched alkyl group having 1 to 12 carbon atoms, a substituted or unsubstituted alicyclic hydrocarbon group having 5 to 25 carbon atoms, or a substituted or unsubstituted aromatic hydrocarbon group having 6 to 12 carbon atoms, and k1, k2, and k3 are independently an integer from 0 to 5, provided that a plurality of $R^{a1}$ are either identical or different when a plurality of $R^{a1}$ are present, a plurality of $R^{a2}$ are either identical or different when a plurality of $R^{a2}$ are present, a plurality of $R^{a3}$ are either identical or different when a plurality of $R^{a3}$ are present, a plurality of $R^P$ are either identical or different when a plurality of $R^P$ are present, and a plurality of $R^Q$ are either identical or different when a plurality of $R^Q$ are present.

In the formula (X-2), $R^{b1}$ is a substituted or unsubstituted monovalent linear or branched alkyl group having 1 to 8 carbon atoms, or a substituted or unsubstituted aromatic hydrocarbon group having 6 to 8 carbon atoms, k4 is an integer from 0 to 7, provided that a plurality of $R^{b1}$ are either identical or different, and optionally bond to each other to form a cyclic structure when a plurality of $R^{b1}$ are present, $R^{b2}$ is a substituted or unsubstituted monovalent linear or branched alkyl group having 1 to 7 carbon atoms, or a substituted or unsubstituted aromatic hydrocarbon group having 6 or 7 carbon atoms, k5 is an integer from 0 to 6, provided that a plurality of $R^{b2}$ are either identical or different, and optionally bond to each other to form a cyclic structure when a plurality of $R^{b2}$ are present, and q is an integer from 0 to 3.

In the formula (X-3), $R^{c1}$ and $R^{c2}$ are independently a substituted or unsubstituted linear or branched alkyl group having 1 to 12 carbon atoms, a substituted or unsubstituted aromatic hydrocarbon group having 6 to 12 carbon atoms, $-OSO_2-R^R$, or $-SO_2-R^S$, provided that two or more groups among $R^{c1}$ and $R^{c2}$ optionally bond to each other to form a cyclic structure, $R^R$ and $R^S$ are independently a substituted or unsubstituted monovalent linear or branched alkyl group having 1 to 12 carbon atoms, a substituted or unsubstituted alicyclic hydrocarbon group having 5 to 25 carbon atoms, or a substituted or unsubstituted aromatic hydrocarbon group having 6 to 12 carbon atoms, and k6 to k7 are independently an integer from 0 to 5, provided that a plurality of $R^{c1}$ are either identical or different when a plurality of $R^{c1}$ are present, a plurality of $R^{c2}$ are either identical or different when a plurality of $R^{c2}$ are present, a plurality of $R^R$ are either identical or different when a plurality of $R^R$ are present, and a plurality of $R^S$ are either identical or different when a plurality of $R^S$ are present.

Examples of the unsubstituted linear alkyl group represented by $R^{a1}$ to $R^{a3}$, $R^{b1}$, $R^{b2}$, $R^{c1}$, and $R^{c2}$ include a methyl group, an ethyl group, an n-propyl group, an n-butyl group, and the like.

Examples of the unsubstituted branched alkyl group represented by $R^{a1}$ to $R^{a3}$, $R^{b1}$, $R^{b2}$, $R^{c1}$, and $R^{c2}$ include an i-propyl group, an i-butyl group, an sec-butyl group, a t-butyl group, and the like.

Examples of the unsubstituted aromatic hydrocarbon group represented by $R^{a1}$ to $R^{a3}$, $R^{c1}$, and $R^{c2}$ include aryl groups such as a phenyl group, a tolyl group, a xylyl group, a mesityl group, and a naphthyl group; aralkyl groups such as a benzyl group and a phenethyl group; and the like.

Examples of the unsubstituted aromatic hydrocarbon group represented by $R^{b1}$ and $R^{b2}$ include a phenyl group, a tolyl group, a benzyl group, and the like.

Examples of a substituent that may substitute a hydrogen atom of the alkyl group or the aromatic hydrocarbon group include a halogen atom (e.g., fluorine atom, chlorine atom, bromine atom, and iodine atom), a hydroxyl group, a carboxyl group, a cyano group, a nitro group, an alkoxy group, an alkoxycarbonyl group, an alkoxycarbonyloxy group, an acyl group, an acyloxy group, and the like.

Among these, a halogen atom is preferable, and a fluorine atom is more preferable.

$R^{a1}$ to $R^{a3}$, $R^{b1}$, $R^{b2}$, $R^{c1}$, and $R^{c2}$ are preferably an unsubstituted linear or branched alkyl group, a fluoroalkyl group, an unsubstituted monovalent aromatic hydrocarbon group, $-OSO_2-R''$, or $-SO_2-R''$, more preferably a fluoroalkyl group or an unsubstituted monovalent aromatic hydrocarbon group, and still more preferably a fluoroalkyl group. Note that R" is an unsubstituted monovalent alicyclic hydrocarbon group or an unsubstituted monovalent aromatic hydrocarbon group.

k1, k2, and k3 in the formula (X-1) are preferably an integer from 0 to 2, more preferably 0 or 1, and still more preferably 0.

k4 in the formula (X-2) is preferably an integer from 0 to 2, more preferably 0 or 1, and still more preferably 1. k5 is preferably an integer from 0 to 2, more preferably 0 or 1, and still more preferably 0.

k6 and k7 in the formula (X-3) are preferably an integer from 0 to 2, more preferably 0 or 1, and still more preferably 0.

Examples of the acid generator represented by the formula (3) include compounds respectively represented by the following formulas (3-1) to (3-11) (hereinafter may respectively be referred to as "compounds (3-1) to (3-11)"), and the like.

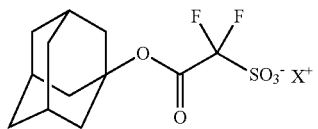
(3-1)

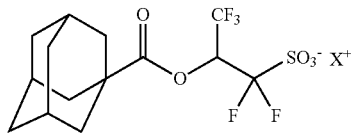
(3-2)

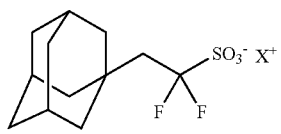
(3-3)

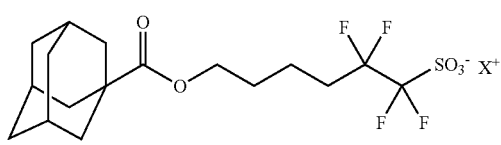
(3-4)

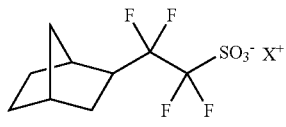
(3-5)

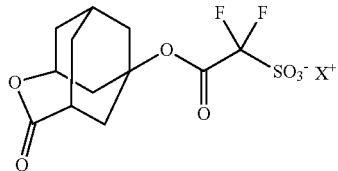
(3-6)

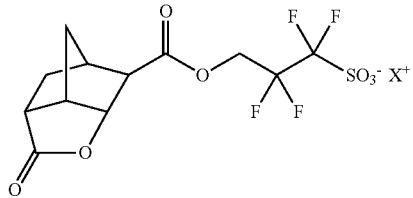
(3-7)

-continued

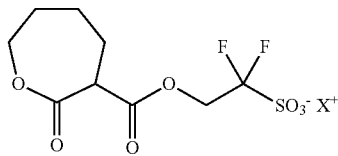
(3-8)

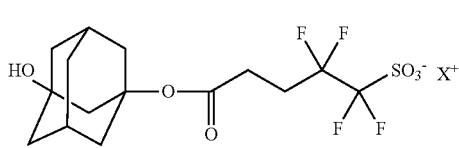
(3-9)

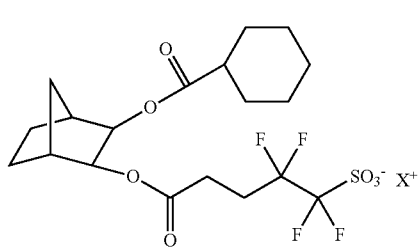
(3-10)

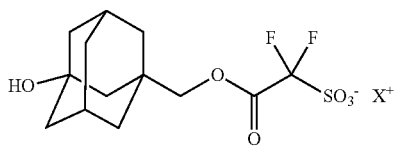
(3-11)

wherein $X^+$ is the same as defined for the formula (3).

The acid generator [B] is preferably an onium salt compound, more preferably a sulfonium salt or a tetrahydrothiophenium salt, and still more preferably the compound (3-2), the compound (3-3), the compound (3-4), or the compound (3-11).

The acid generator [B] is preferably used in an amount of 0.1 to 30 parts by mass, more preferably 0.5 to 20 parts by mass, and still more preferably 1 to 15 parts by mass, based on 100 parts by mass of the polymer [A], from the viewpoint of providing the resist composition with sensitivity and developability. When the acid generator [B] is used in an amount within the above range, the resist composition exhibits improved sensitivity and developability. The resist composition may include only one type of the acid generator [B], or may include two or more types of the acid generator [B].

Acid Diffusion Controller [C]

The resist composition may optionally include the acid diffusion controller [C].

The acid diffusion controller [C] controls a phenomenon in which the acid generated by the acid generator [B] upon exposure is diffused in the resist film, and suppresses undesired chemical reactions in the unexposed area. This makes it possible to further improve the resolution of the resist, suppress a change in line width of the resist pattern due to a change in post-exposure delay from exposure to development, and provide a resist composition that exhibits excellent process stability. The acid diffusion controller [C] may be included in the resist composition in the form of a free compound, and/or may be included in the polymer.

Examples of the acid diffusion controller [C] include a compound represented by the following formula (4) (hereinafter may be referred to as "nitrogen-containing compound (I)"), a compound that includes two nitrogen atoms in one molecule (hereinafter may be referred to as "nitrogen-containing compound (II)"), a compound that includes three nitrogen atoms in one molecule (hereinafter may be referred to as "nitrogen-containing compound (III)"), an amide group-containing compound, a urea compound, a nitrogen-containing heterocyclic compound, and the like.

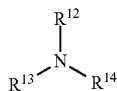

(4)

wherein $R^{12}$, $R^{13}$, and $R^{14}$ are independently a hydrogen atom, a substituted or unsubstituted linear, branched, or cyclic alkyl group, an aryl group, or an aralkyl group.

Examples of the nitrogen-containing compound (I) include monoalkylamines such as n-hexylamine; dialkylamines such as di-n-butylamine; trialkylamines such as triethylamine; aromatic amines such as aniline; and the like.

Examples of the nitrogen-containing compound (II) include ethylenediamine, N,N,N',N'-tetramethylethylenediamine, and the like.

Examples of the nitrogen-containing compound (III) include polyamine compounds such as polyethyleneimine and polyallylamine; polydimethylaminoethylacrylamide; and the like.

Examples of the amide-containing compound include formamide, N-methylformamide, N,N-dimethylformamide, acetamide, N-methylacetamide, N,N-dimethylacetamide, propionamide, benzamide, pyrrolidone, N-methylpyrrolidone, and the like.

Examples of the urea compound include urea, methylurea, 1,1-dimethylurea, 1,3-dimethylurea, 1,1,3,3-tetramethylurea, 1,3-diphenylurea, tributylthiourea, and the like.

Examples of the nitrogen-containing heterocyclic compound include pyridines such as pyridine and 2-methylpyridine, morpholines such as N-propylmorpholine and N-(undecylcarbonyloxyethyl)morpholine, pyrazine, pyrazole, and the like.

A compound that includes an acid-labile group may also be used as the nitrogen-containing organic compound.

Examples of the nitrogen-containing organic compound that includes an acid-labile group include N-t-butoxycarbonylpiperidine, N-t-butoxycarbonylimidazole, N-t-butoxycarbonylbenzimidazole, N-t-butoxycarbonyl-2-phenylbenzimidazole, N-(t-butoxycarbonyl)di-n-octylamine, N-(t-butoxycarbonyl)diethanolamine, N-(t-butoxycarbonyl)dicyclohexylamine, N-(t-butoxycarbonyl)diphenylamine, N-t-butoxycarbonyl-4-hydroxypiperidine, N-t-amyloxycarbonyl-4-hydroxypiperidine, and the like.

A photodegradable base that generates a weak acid upon exposure may also be used as the acid diffusion controller [C]. Examples of the photodegradable base include an onium salt compound that loses acid diffusion controllability upon decomposition due to exposure, and the like. Examples of the onium salt compound include a sulfonium salt compound represented by the following formula (5-1), an iodonium salt compound represented by the following formula (5-2), and the like.

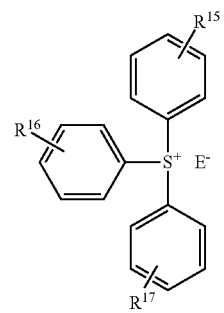

(5-1)

(5-2)

wherein $R^{15}$ to $R^{19}$ are independently a hydrogen atom, an alkyl group, an alkoxy group, a hydroxyl group, or a halogen atom, $E^-$ and $Q^-$ are independently $OH^-$, $R^\beta$—$COO^-$, $R^\beta$—$SO_3^-$, or an anion represented by the following formula (5-3), and $R^\beta$ is an alkyl group, an aryl group, or an alkaryl group.

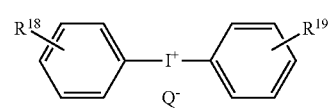

(5-3)

wherein $R^{20}$ is a linear or branched alkyl group having 1 to 12 carbon atoms wherein some or all of the hydrogen atoms are optionally substituted with a fluorine atom, or a linear or branched alkoxy group having 1 to 12 carbon atoms, and u is an integer from 0 to 2.

Examples of the photodegradable base include the compounds respectively represented by the following formulas, and the like.

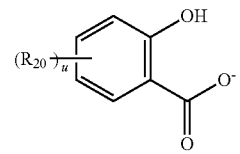

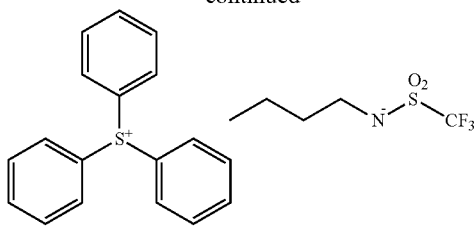
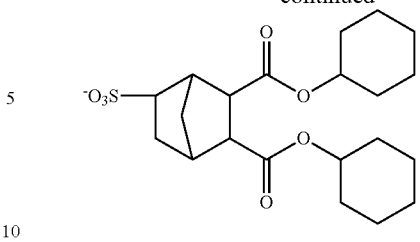

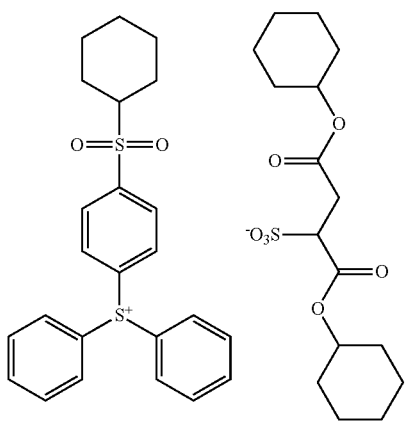

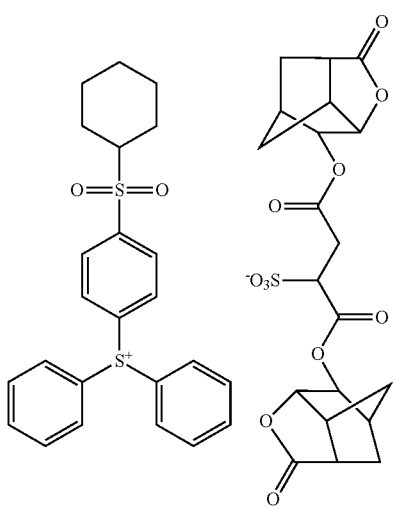

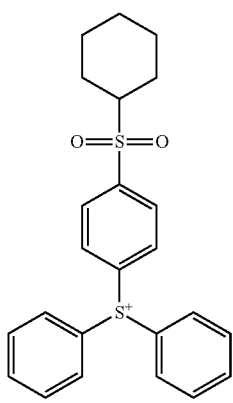

The photodegradable base is preferably a sulfonium salt, more preferably a triarylsulfonium salt, and still more preferably triphenylsulfonium salicylate or triphenylsulfonium 10-camphorsulfonate.

The acid diffusion controller [C] is preferably used in an amount of 0 to 20 parts by mass, more preferably 0.1 to 15 parts by mass, and still more preferably 0.3 to 10 parts by mass, based on 100 parts by mass of the polymer [A]. If the amount of the acid diffusion controller [C] exceeds 20 parts by mass, the sensitivity of the resist composition may deteriorate.

Polymer [D]

The polymer [D] is a fluorine atom-containing polymer (excluding a fluorine atom-containing polymer that falls under the polymer [A]). When the resist composition includes the polymer [D], the polymer [D] tends to be unevenly distributed in the surface area of a resist film formed using the resist composition due to the oil repellency of the polymer [D], and elution of the acid generator, the acid diffusion controller, and the like into an immersion medium can be suppressed during liquid immersion lithography. It is also possible to control the advancing contact angle of the resist film with the immersion medium within the desired range due to the water repellency of the polymer [D], and suppress occurrence of bubble defects. Moreover, since the receding contact angle of the resist film with the immersion medium increases (i.e., water droplets do not remain), it is possible to implement high-speed scan exposure. A resist film that is suitable for liquid immersion lithography can be formed by incorporating the polymer [D] in the resist composition.

The polymer [D] is not particularly limited as long as the polymer [D] includes a fluorine atom. It is preferable that the polymer [D] have a fluorine atom content (mass %) higher than that of the polymer [A] included in the resist composition. The degree of uneven distribution increases when the polymer [D] has a fluorine atom content higher than that of the polymer [A], and the properties (e.g., water repellency and elution resistance) of the resulting resist film are improved.

The fluorine atom content in the polymer [D] is preferably 1 mass % or more, more preferably 2 to 60 mass %, still more preferably 4 to 40 mass %, and particularly preferably 7 to 30 mass %. If the fluorine atom content in the polymer [D] is less than 1 mass %, the hydrophobicity of the surface of the resist film may deteriorate. Note that the fluorine atom content (mass %) in the polymer may be calculated from the structure of the polymer determined by $^{13}$C-NMR spectrum measurement.

It is preferable that the polymer [D] include at least one structural unit selected from the group consisting of a structural unit (Da) and a structural unit (Db). The polymer [D] may include only one type of the structural unit (Da), or may include two or more types of the structural unit (Da). The polymer [D] may include only one type of the structural unit (Db), or may include two or more types of the structural unit (Db).

Structural Unit (Da)

The structural unit (Da) is a structural unit represented by the following formula (6a). The fluorine atom content in the polymer [D] can be adjusted by incorporating the structural unit (Da) in the polymer [D].

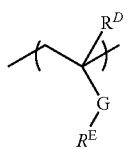
(6a)

wherein $R^D$ is a hydrogen atom, a methyl group, or a trifluoromethyl group, G is a single bond, an oxygen atom, a sulfur atom, —CO—O—, —SO$_2$—O—NH—, —CO—NH—, or —O—CO—NH—, and $R^E$ is a monovalent chain-like hydrocarbon group having 1 to 6 carbon atoms that includes at least one fluorine atom, or a monovalent alicyclic hydrocarbon group having 4 to 20 carbon atoms that includes at least one fluorine atom.

Examples of the chain-like hydrocarbon group having 1 to 6 carbon atoms represented by $R^E$ that includes at least one fluorine atom include a trifluoromethyl group, a 2,2,2-trifluoroethyl group, a perfluoroethyl group, 2,2,3,3,3-pentafluoropropyl group, a 1,1,1,3,3,3-hexafluoropropyl group, a perfluoro-n-propyl group, a perfluoro-i-propyl group, a perfluoro-n-butyl group, a perfluoro-i-butyl group, a perfluoro-t-butyl group, a 2,2,3,3,4,4,5,5-octafluoropentyl group, a perfluorohexyl group, and the like.

Examples of the alicyclic hydrocarbon group having 4 to 20 carbon atoms represented by $R^E$ that includes at least one fluorine atom include a monofluorocyclopentyl group, a difluorocyclopentyl group, a perfluorocyclopentyl group, a monofluorocyclohexyl group, a difluorocyclopentyl group, a perfluorocyclohexylmethyl group, a fluoronorbornyl group, a fluoroadamantyl group, a fluorobornyl group, a fluoroisobornyl group, a fluorotricyclodecyl group, a fluorotetracyclodecyl group, and the like.

Examples of a monomer that produces the structural unit (Da) include trifluoromethyl (meth)acrylate, 2,2,2-trifluoroethyl (meth)acrylate, 2,2,2-trifluoroethyloxycarbonylmethyl (meth)acrylate, perfluoroethyl (meth)acrylate, perfluoro-n-propyl (meth)acrylate, perfluoro-i-propyl (meth)acrylate, perfluoro-n-butyl (meth)acrylate, perfluoro-i-butyl (meth)acrylate, perfluoro-t-butyl (meth)acrylate, 2-(1,1,1,3,3,3-hexafluoropropyl) (meth)acrylate, 1-(2,2,3,3,4,4,5,5-octafluoropentyl) (meth)acrylate, perfluorocyclohexylmethyl (meth)acrylate, 1-(2,2,3,3,3-pentafluoropropyl) (meth)acrylate, monofluorocyclopentyl (meth)acrylate, difluorocyclopentyl (meth)acrylate, perfluorocyclopentyl (meth)acrylate, monofluorocyclohexyl (meth)acrylate, difluorocyclopentyl (meth)acrylate, perfluorocyclohexylmethyl (meth)acrylate, fluoronorbornyl (meth)acrylate, fluoroadamantyl (meth)acrylate, fluorobornyl (meth)acrylate, fluoroisobornyl (meth)acrylate, fluorotricyclodecyl (meth)acrylate, fluorotetracyclodecyl (meth)acrylate, and the like.

Among these, 2,2,2-trifluoroethyloxycarbonylmethyl (meth)acrylate is preferable.

The content of the structural unit (Da) in the polymer [D] is preferably 5 to 95 mol %, more preferably 10 to 90 mol %, and still more preferably 30 to 85 mol %, based on the total structural units included in the polymer [D]. When the content of the structural unit (Da) is within the above range, the surface of the resist film exhibits a higher dynamic contact angle during liquid immersion lithography.

Structural Unit (Db)

The structural unit (Db) is a structural unit represented by the following formula (6b). When the polymer [D] includes the structural unit (Db), the polymer [D] exhibits improved hydrophobicity, and the dynamic contact angle of the surface of a resist film formed using the resulting resist composition can be further improved.

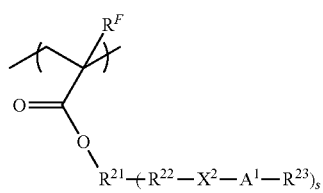
(6b)

wherein $R^F$ is a hydrogen atom, a methyl group, or a trifluoromethyl group, $R^{21}$ is an (s+1)-valent hydrocarbon group having 1 to 20 carbon atoms, provided that an oxygen atom, a sulfur atom, —NR'—, a carbonyl group, —CO—O—, or —CO—NH— is optionally bonded to the end of $R^{21}$ that is bonded to $R^{22}$, R' is a hydrogen atom or a monovalent organic group, $R^{22}$ is a single bond, a divalent chain-like hydrocarbon group having 1 to 10 carbon atoms, or a divalent alicyclic hydrocarbon group having 4 to 20 carbon atoms, $X^2$ is a divalent chain-like hydrocarbon group having 1 to 20 carbon atoms that includes at least one fluorine atom, $A^1$ is an oxygen atom, —NR"—, —CO—O—*, or —SO$_2$—O—*, R" is a hydrogen atom or a monovalent organic group, * is a bonding site to which $R^{21}$ is bonded, $R^{23}$ is a hydrogen atom or a monovalent organic group, and s is an integer from 1 to 3, provided that a plurality of $R^{22}$, a plurality of $X^2$, a plurality of $A^1$, and a plurality of $R^{23}$ are respectively either identical or different when s is 2 or 3.

When $R^{23}$ is a hydrogen atom, the polymer [D] exhibits improved solubility in an alkaline developer.

Examples of the monovalent organic group represented by $R^{23}$ include an acid-labile group, an alkali-labile group, a substituted or unsubstituted hydrocarbon group having 1 to 30 carbon atoms, and the like.

Examples of the structural unit (Db) include structural units respectively represented by the following formulas (6b-1) to (6b-3), and the like.

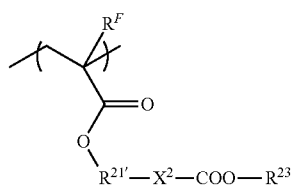
(6b-1)

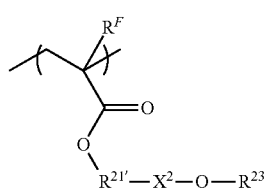
(6b-2)

-continued

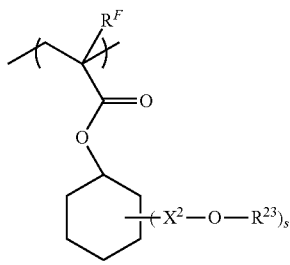

(6b-3)

wherein $R^{21'}$ is a divalent linear, branched, or cyclic saturated or unsaturated hydrocarbon group having 1 to 20 carbon atoms, and $R^F$, $X^2$, $R^{23}$, and s are the same as defined for the formula (6b), provided that a plurality of $X^2$ and a plurality of $R^{23}$ are respectively either identical or different when s is 2 or 3.

The content of the structural unit (Db) in the polymer [D] is preferably 0 to 90 mol %, more preferably 5 to 85 mol %, and still more preferably 10 to 80 mol %, based on the total structural units included in the polymer [D]. When the content of the structural unit (Db) is within the above range, the surface of a resist film formed using the resist composition exhibits an improved dynamic contact angle during alkali development.

Structural Unit (Dc)

The polymer [D] may include an acid-labile group-containing structural unit (hereinafter may be referred to as "structural unit (Dc)") (excluding an acid-labile group-containing structural unit that falls under the structural unit (Db)) in addition to the structural unit (Da) and the structural unit (Db) When the polymer [D] includes the structural unit (Dc), the shape of the resulting resist pattern is further improved. Examples of the structural unit (Dc) include the structural unit (I) mentioned above in connection with the polymer [A], and the like.

The content of the structural unit (Dc) in the polymer [D] is preferably 5 to 90 mol %, more preferably 10 to 70 mol %, still more preferably 15 to 60 mol %, and particularly preferably 15 to 50 mol %, based on the total structural units included in the polymer [D]. If the content of the structural unit (Dc) is less than 5 mol %, it may be difficult to sufficiently suppress development defects in the resist pattern. If the content of the structural unit (Dc) exceeds 90 mol %, the hydrophobicity of the surface of the resulting resist film may deteriorate.

Additional Structural Unit

The polymer [D] may further include an additional structural unit such as a structural unit that includes an alkali-soluble group, a structural unit that includes at least one structure selected from the group consisting of a lactone structure, a cyclic carbonate structure, and a sultone structure, and a structural unit that includes an alicyclic group. Examples of the alkali-soluble group include a carboxyl group, a sulfonamide group, a sulfo group, and the like. Examples of the structural unit that includes at least one structure selected from the group consisting of a lactone structure, a cyclic carbonate structure, and a sultone structure include the structural unit (II) mentioned above in connection with the polymer [A], and the like.

The content of the additional structural unit in the polymer [D] is normally 30 mol % or less, and more preferably 20 mol % or less, based on the total structural units included in the polymer [D]. If the content of the additional structural unit exceeds 30 mol %, the pattern-forming capability of the resist composition may deteriorate.

The polymer [D] is preferably used in an amount of 0 to 20 parts by mass, more preferably 0.5 to 15 parts by mass, and still more preferably 1 to 10 parts by mass, based on 100 parts by mass of the polymer [A]. If the amount of the polymer [D] exceeds 20 parts by mass, the pattern-forming capability of the resist composition may deteriorate.

Additional Optional Component

The resist composition may further include an additional optional component in addition to the components [S] and [A] to [D]. Examples of the additional optional component include a surfactant, an alicyclic skeleton-containing compound, a sensitizer, and the like. These additional optional components may respectively be used alone or in combination.

Surfactant

The surfactant improves applicability, striation, developability, and the like. Examples of the surfactant include nonionic surfactants such as polyoxyethylene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, and polyethylene glycol distearate; commercially available products such as KP341 (manufactured by Shin-Etsu Chemical Co., Ltd.), Polyflow No. 75, Polyflow No. 95 (manufactured by Kyoeisha Chemical Co., Ltd.), EFTOP EF301, EFTOP EF303, EFTOP EF352 (manufactured by JEMCO, Inc.), Megafac F171, Megafac F173 (manufactured by DIC Corporation), Fluorad FC430, Fluorad FC431 (manufactured by Sumitomo 3M Ltd.), Asahi Guard AG710, Surflon S-382, Surflon SC-101, Surflon SC-102, Surflon SC-103, Surflon SC-104, Surflon SC-105, Surflon SC-106 (manufactured by Asahi Glass Co., Ltd.); and the like. The surfactant is normally used in an amount of 2 parts by mass or less based on 100 parts by mass of the polymer [A].

Alicyclic Skeleton-Containing Compound

The alicyclic skeleton-containing compound improves the dry etching resistance, the pattern shape, adhesion to a substrate, and the like.

Examples of the alicyclic skeleton-containing compound include adamantane derivatives such as 1-adamantanecarboxylic acid, 2-adamantanone, and t-butyl 1-adamantanecarboxylate; deoxycholates such as t-butyl deoxycholate, t-butoxycarbonylmethyl deoxycholate, and 2-ethoxyethyl deoxycholate; lithocholates such as t-butyl lithocholate, t-butoxycarbonylmethyl lithocholate, and 2-ethoxyethyl lithocholate; 3-[2-hydroxy-2,2-bis(trifluoromethyl)ethyl]tetracyclo[4.4.0.1$^{2,5}$.1$^{7,10}$]dodecane; 2-hydroxy-9-methoxycarbonyl-5-oxo-4-oxa-tricyclo[4.2.1.0$^{3,7}$]nonane; and the like. The alicyclic skeleton-containing compound is normally used in an amount of 5 parts by mass or less based on 100 parts by mass of the polymer [A].

Sensitizer

The sensitizer increases the amount of acid generated by the acid generator [B], and improves the apparent sensitivity of the resist composition, for example.

Examples of the sensitizer include carbazoles, acetophenones, benzophenones, naphthalenes, phenols, biacetyl, eosine, rose bengal, pyrenes, anthracenes, phenothiazines, and the like. These sensitizers may be used either alone or in combination. The sensitizer is normally used in an amount of 2 parts by mass or less based on 100 parts by mass of the polymer [A].

Preparation of Resist Composition

The resist composition may be prepared by mixing the polymer [A], the acid generator [B], the acid diffusion controller [C], the polymer [B], an additional optional component, and the solvent [S] in given ratio, for example. The resist composition thus prepared is preferably filtered through a filter having a pore size of about 0.2 μm, for example. The solid content in the resist composition is normally 0.1 to 50 mass %, preferably 0.5 to 30 mass %, and more preferably 1 to 20 mass %.

Resist Pattern-Forming Method

The resist pattern-forming method includes forming a resist film using the resist composition (hereinafter may be referred to as "resist film-forming step"), exposing the resist film (hereinafter may be referred to as "exposure step"), and developing the exposed resist film (hereinafter may be referred to as "development step").

Since the resist pattern-forming method utilizes the resist composition, it is possible to form a resist pattern while achieving excellent LWR performance and excellent CDU performance, reducing development defects, and suppressing a top-loss phenomenon. Each step is described below.

Resist Film-Forming Step

In the resist film-forming step, the resist film is formed using the resist composition. The resist film may be formed on a known substrate such as a silicon wafer, or a silicon dioxide or aluminum-coated wafer. An organic or inorganic antireflective film disclosed in Japanese Patent Publication (KOKOKU) No. 6-12452, Japanese Patent Application Publication (KOKAI) No. 59-93448, or the like may be formed on the substrate. The resist composition may be applied by spin coating, cast coating, roll coating, or the like. The resist film formed by applying the resist composition may optionally be prebaked (PB) to vaporize the solvent from the film. The PB temperature is normally 60 to 140° C., and preferably 80 to 120° C. The PB time is normally 5 to 600 seconds, and preferably 10 to 300 seconds. The thickness of the resist film is preferably 10 to 1000 nm, and more preferably 10 to 500 nm.

When liquid immersion lithography is employed, and the resist composition does not include a water-repellent polymer additive, for example, a protective film that is insoluble in an immersion liquid may be formed on the resist film so that the immersion liquid does not come in direct contact with the resist film. A solvent removal-type protective film that is removed using a solvent prior to the development step (see Japanese Patent Application Publication (KOKAI) No. 2006-227632, for example), or a developer removal-type protective film that is removed during the development step (see WO2005-069076 and WO2006-035790, for example) may be used as the protective film. Note that it is preferable to use the developer removal-type protective film from the viewpoint of throughput.

Exposure Step

In the exposure step, the resist film formed by the resist film-forming step is exposed by applying exposure light (optionally through an immersion medium such as water). Examples of the exposure light include electromagnetic waves such as visible light, ultraviolet rays, deep ultraviolet rays, X-rays, and γ-rays, charged particle rays such as electron beams and α-rays, and the like. The exposure light may be appropriately selected depending on the line width of the desired pattern. It is preferable to use deep ultraviolet rays or electron beams, more preferably ArF excimer laser light (wavelength: 193 nm), KrF excimer laser light (wavelength: 248 nm), or electron beams, and still more preferably ArF excimer laser light or electron beams.

Examples of the immersion liquid used for liquid immersion lithography (i.e., exposure) include water, a fluorine-containing inert liquid, and the like. It is preferable that the immersion liquid be transparent to the exposure wavelength, and have a temperature coefficient of the refractive index as small as possible in order to minimize distortion of the optical image projected onto the film. In particular, when using ArF excimer laser light (wavelength: 193 nm) as exposure light, it is preferable to use water from the viewpoint of availability and ease of handling. When using water as the immersion liquid, a small amount of an additive that decreases the surface tension of water and increases the surface activity of water may be added to the water. It is preferable that the additive does not dissolve the resist layer formed on the wafer, and does not significantly affect the optical coating formed on the bottom surface of the lens. It is preferable to use distilled water as the water.

The exposed resist film is preferably subjected to post-exposure bake (PEB) to promote dissociation of the acid-labile group included in the polymer [A] or the like due to the acid generated by the acid generator [B] in the exposed area of the resist film. A difference in solubility in a developer thus occurs between the exposed area and the unexposed area. The PEB temperature is normally 50 to 180° C., and preferably 80 to 130° C. The PEB time is normally 5 to 600 seconds, and preferably 10 to 300 seconds.

Development Step

In the development step, the resist film exposed by the exposure step is developed. A given resist pattern can be formed by performing the development step. After development, the resist pattern is normally rinsed with a rinse agent (e.g., water or alcohol), and dried.

Examples of an alkaline developer used for the development step include an alkaline aqueous solution prepared by dissolving at least one alkaline compound (e.g., sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide (TMAH), pyrrole, piperidine, choline, 1,8-diazabicyclo-[5.4.0]-7-undecene, or 1,5-diazabicyclo-[4.3.0]-5-nonene) in water. It is preferable to use a TMAH aqueous solution, and more preferably a 2.38 mass % TMAH aqueous solution.

Example of an organic solvent used for the development step include hydrocarbon-based solvents, ether-based solvents, ester-based solvents, ketone-based solvents, alcohol-based solvents, and solvents that include such an organic solvent.

The organic solvent may be one solvent or two or more solvents among the solvents mentioned above in connection with the solvent [E] included in the resist composition, and the like. Note that it is preferable to use an ether-based solvent or a ketone-based solvent. A preferable ester-based solvent is an acetate-based solvent, and more preferably n-butyl acetate. A preferable ketone-based solvent is a chain-like ketone, and more preferably 2-heptanone. The content of the organic solvent in the developer is preferably 80 mass % or more, more preferably 90 mass % or more, still more preferably 95 mass % or more, and particularly preferably 99 mass % or more. Examples of a component other than the organic solvent that may be include in the developer include water, silicone oil, and the like.

Examples of the development method include a dipping method that immerses the substrate in a bath filled with the developer for a given time, a puddle method that allows the developer to be present on the surface of the substrate for a given time utilizing surface tension, a spray method that sprays the developer onto the surface of the substrate, a dynamic dispensing method that applies the developer to the substrate that is rotated at a constant speed while scanning with a developer application nozzle at a constant speed, and the like.

Resist Solvent

The resist solvent includes a compound that includes a ketonic carbonyl group and an alcoholic hydroxyl group.

A resist composition that includes the resist solvent exhibits improved LWR performance, CDU performance, defect suppression capability, applicability, and storage stability. The details of the resist solvent have been described above in connection with the solvent [S] included in the resist composition (A).

A resist composition that includes the resist solvent exhibits excellent applicability even when applying the resist composition to a large substrate such as a wafer having a diameter of 450 mm.

EXAMPLES

The invention is further described below by way of examples. Note that the invention is not limited to the following examples. The property values were measured using the following methods.

Mw and Mn

The Mw and the Mn of the polymer were measured by GPC under the following conditions.

GPC column: G2000HXL×2, G3000HXL×1, G4000HXL×1 (manufactured by Tosoh Corporation)

Column temperature: 40° C.

Eluant: tetrahydrofuran (manufactured by Wako Pure Chemical Industries, Ltd.)

Flow rate: 1.0 ml/min

Sample concentration: 1.0 mass %

Amount of sample introduced: 100 μL

Detector: differential refractometer

Standard: monodisperse polystyrene $^{13}$C-NMR Analysis $^{13}$C-NMR analysis was performed using a nuclear magnetic resonance spectrometer ("JNM-ECX400" manufactured by JEOL Ltd.) (solvent: deuterated chloroform).

Synthesis of Polymer

The following monomers were used to synthesize the polymer [A] and the polymer [D].

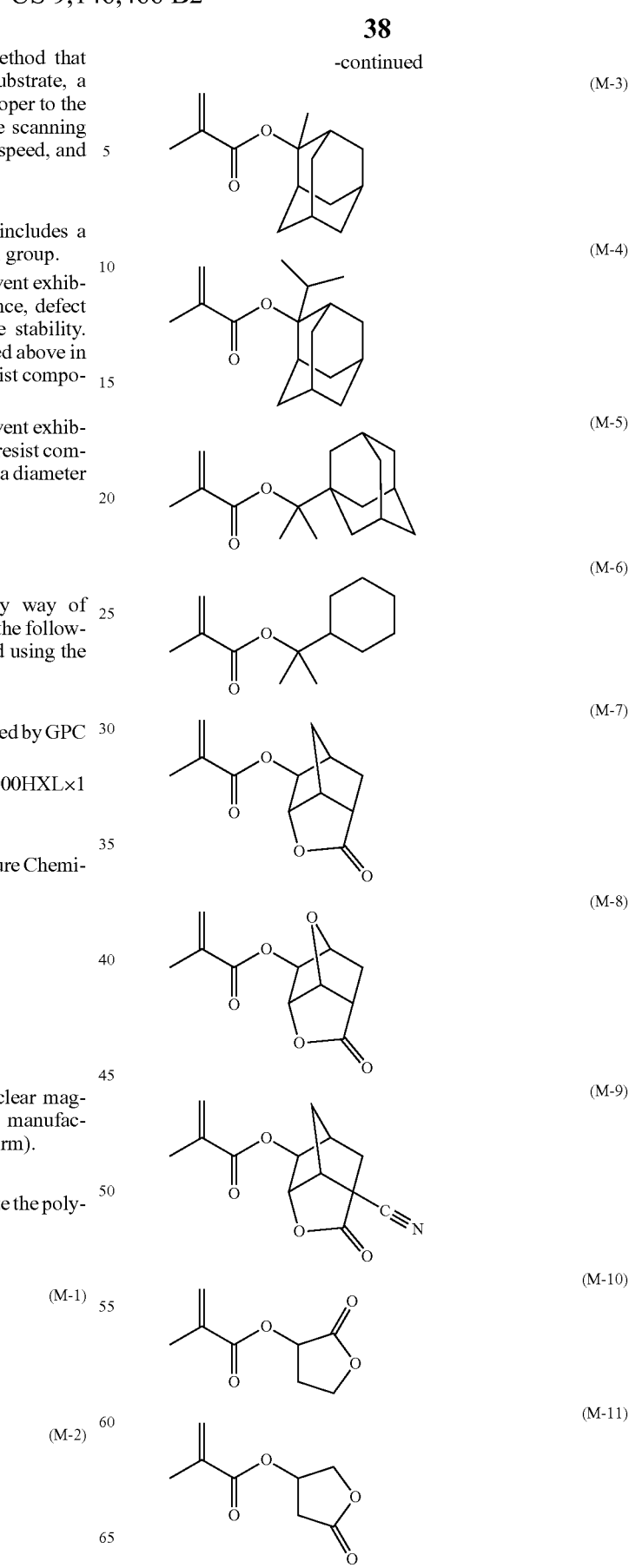

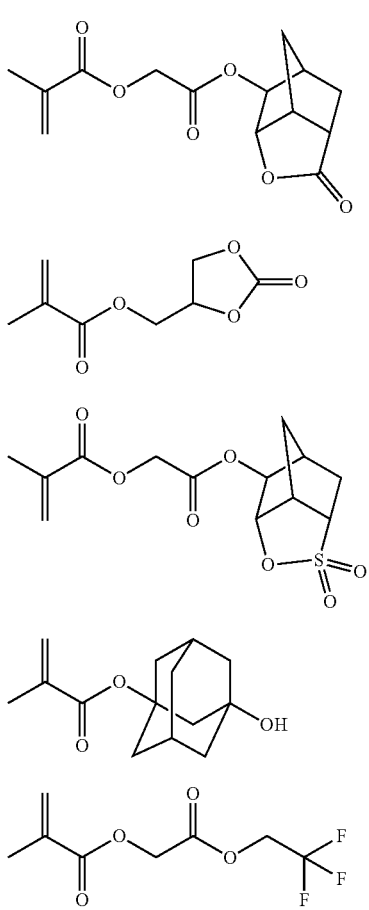

moles of the compounds) of AIBN (initiator) was added to the solution to prepare a monomer solution. A three-necked flask (100 mL) was charged with 20 g of 2-butanone, purged with nitrogen for 30 minutes, and heated to 80° C. with stirring. The monomer solution prepared as described above was added dropwise to the flask from a dropping funnel over 4 hours. The monomers were polymerized for 6 hours from the start of dropwise addition of the monomer solution. After completion of polymerization, the polymer solution was cooled with water to 30° C. or less. The polymer solution was then poured into 400 g of methanol, and a white powder (precipitate) was filtered off. The white powder was washed twice with 80 g of methanol, filtered off, and dried at 60° C. for 17 hours to obtain a white powdery polymer (A-1) (16.2 g, yield: 81%). The polymer (A-1) had an Mw of 6400 and a dispersity (Mw/Mn) of 1.55. It was found by $^{13}$C-NMR analysis that the content of structural units derived from the compound (M-1) and the content of structural units derived from the compound (M-7) in the polymer (A-1) were 58.4 mol % and 41.6 mol %, respectively.

Synthesis Examples 2 to 7

A polymer (polymers (A-2) to (A-7)) was synthesized in the same manner as in Synthesis Example 1, except that the monomers shown in Table 1 were respectively used in the amounts shown in Table 1. Note that the monomers were used in a total mass of 20.0 g. The symbol "-" in Table 1 indicates that the corresponding monomer was not used. The content of each structural unit, the yield (%), the Mw, and the dispersity (Mw/Mn) of the resulting polymer are also shown in Table 1.

TABLE 1

| | | Structural unit (I) | | Structural unit (II) | | Structural unit (III) | | | | |
|---|---|---|---|---|---|---|---|---|---|---|
| | Component [A] | Monomer Type | Amount (mol %) | Content of structural unit (mol %) | Monomer Type | Amount (mol %) | Content of structural unit (mol %) | Monomer Type | Amount (mol %) | Content of structural unit (mol %) | Yield (%) | Mw | Mw/Mn |
| Synthesis Example 1 | A-1 | M-1 | 60 | 58.4 | M-7 | 40 | 41.6 | — | — | — | 81 | 6400 | 1.55 |
| Synthesis Example 2 | A-2 | M-6 | 55 | 53.8 | M-9 | 45 | 46.2 | — | — | — | 84 | 8800 | 1.61 |
| Synthesis Example 3 | A-3 | M-4 | 35 | 25.2 | M-11 | 50 | 54.5 | M-15 | 15 | 20.3 | 66 | 6900 | 1.58 |
| Synthesis Example 4 | A-4 | M-5 | 10 | 9.9 | M-10 | 45 | 46.3 | — | — | — | 88 | 7100 | 1.59 |
| | | M-6 | 45 | 43.8 | | | | | | | | | |
| Synthesis Example 5 | A-5 | M-2 | 45 | 42.4 | M-8 | 35 | 34.2 | — | — | — | 69 | 7200 | 1.55 |
| | | | | | M-12 | 20 | 23.4 | | | | | | |
| Synthesis Example 6 | A-6 | M-1 | 35 | 32.1 | M-10 | 25 | 27.1 | M-13 | 5 | 6.9 | 66 | 8000 | 1.61 |
| | | M-3 | 10 | 8.8 | M-14 | 15 | 17.2 | | | | | | |
| | | M-4 | 10 | 7.9 | | | | | | | | | |
| Synthesis Example 7 | A-7 | M-1 | 30 | 26.0 | M-7 | 30 | 34.3 | — | — | — | 75 | 6500 | 1.53 |
| | | M-5 | 10 | 13.5 | M-10 | 30 | 26.2 | | | | | | |

Synthesis of Polymer [A]

Synthesis Example 1

10.6 g (60 mol %) of the compound (M-1) and 9.4 g (40 mol %) of the compound (M-7) were dissolved in 40 g of 2-butanone, and 0.86 g (5 mol % based on the total number of Synthesis of Polymer [D]

Synthesis Example 8

1.8 g (20 mol %) of the compound (M-2) and 8.2 g (20 mol %) of the compound (M-16) were dissolved in 10 g of 2-butanone, and 0.37 g (5 mol % based on the total number of moles of the compounds) of AIBN (initiator) was added to the solution to prepare a monomer solution. A three-necked flask (100 mL) was charged with 5 g of 2-butanone, purged with nitrogen for 30 minutes, and heated to 80° C. with stirring. The monomer solution prepared as described above was added dropwise to the flask from a dropping funnel over 4 hours. The monomers were polymerized for 6 hours from the start of dropwise addition of the monomer solution. After completion of polymerization, the polymer solution was cooled with water to 30° C. or less. After transferring the polymer solution to a separating funnel (500 mL), 10 g of acetonitrile, 5 g of isopropanol, and 65 g of n-hexane were added to the polymer solution, and the mixture was stirred, and allowed to stand for 1 hour. The lower layer was then collected, and the solvent was replaced with propylene glycol monomethyl ether acetate to obtain a propylene glycol monomethyl ether acetate solution of a polymer (D-1) (yield: 77%). The polymer (D-1) had an Mw of 8100 and a dispersity (Mw/Mn) of 1.63. It was found by $^{13}$C-NMR analysis that the content of structural units derived from the compound (M-2) and the content of structural units derived from the compound (M-16) in the polymer (D-1) were 18.5 mol % and 81.5 mol %, respectively.

Preparation of Resist Composition

The resist composition was prepared using the following components.

Acid generator [B] (see the following structural formulas)

B-1: triphenylsulfonium 3-hydroxyadamantan-1-ylmethyloxycarbonyldifluoromethanesulfonate B-2: triphenylsulfonium 2-(adamantan-1-ylcarbonyloxy)-1,1,3,3,3-pentafluoropropane-1-sulfonate B-3: 4-butoxynaphthalen-1-yltetrahydrothiophenium 3-hydroxyadamantan-1-ylmethyloxycarbonyldifluoromethanesulfonate B-4: triphenylsulfonium 2-(adamantan-1-yl)-1,1-difluoroethanesulfonate B-5: triphenylsulfonium 6-(adamantan-1-ylcarbonyloxy)-1,1,2,2-tetrafluorohexane-1-sulfonate

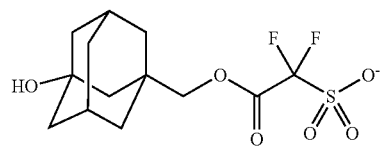

(B-1)

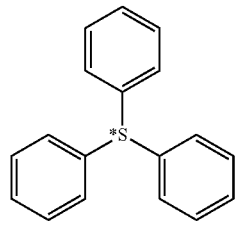

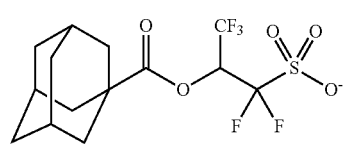

(B-2)

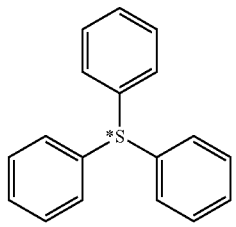

(B-3)

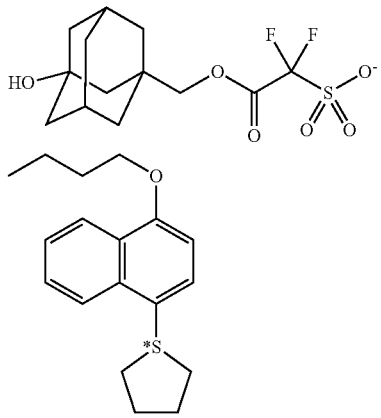

(B-4)

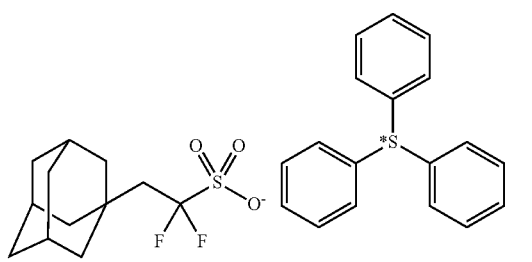

(B-5)

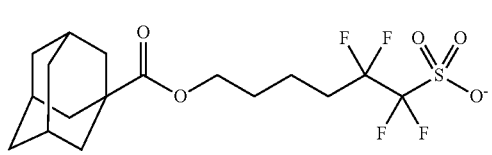

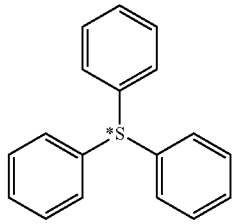

Acid Diffusion Controller [C] (See the Following Structural Formulas)

C-1: triphenylsulfonium 10-camphorsulfonate
C-2: triphenylsulfonium salicylate
C-3: N-(undecan-1-ylcarbonyloxyethyl)morpholine
C-4: N-(t-amyloxycarbonyl)-4-hydroxypiperidine

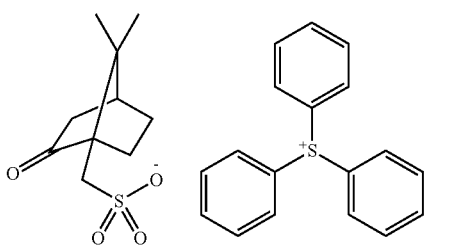

(C-1)

(C-2)

(C-3)

Solvent [S]
S-1: propylene glycol monomethyl ether acetate (PGMEA)
S-2: diacetone alcohol (DAA)
S-3: γ-butyrolactone (GBL)
S-4: cyclohexanone (CHN)
S-5: propylene glycol monomethyl ether (PGME)
S-6: methyl amyl ketone (MAK)
S-7: butyl acetate (BuAc)

Example 1

100 parts by mass of the polymer (A-1) (polymer [A]), 6.19 parts by mass of the acid generator (B-1) (acid generator [B]), 5.25 parts by mass of the acid diffusion controller (C-1) (acid diffusion controller [C]), 5 parts by mass of the polymer (D-1) (polymer [D]), 2264 parts by mass of the solvent (S-1) (solvent [S]), 566 parts by mass of the solvent (S-2) (solvent [S]), and 100 parts by mass of the solvent (S-3) (solvent [S]) were mixed to prepare a resist composition (J-1).

Examples 2 to 15 and Comparative Examples 1 to 4

A resist composition (resist compositions (J-2) to (J-15) and (CJ-1) to (CJ-4)) was prepared in the same manner as in Example 1, except that the type and the amount of each component were changed as shown in Table 2.

TABLE 2

| | Photoresist composition | Component [A] | | Acid generator [B] | | Acid diffusion controller [C] | | Polymer [D] | | Solvent [S] | |
|---|---|---|---|---|---|---|---|---|---|---|---|
| | | Type | Amount (parts by mass) | Type | Amount (parts by mass) | Type | Amount (parts by mass) | Type | Amount (parts by mass) | Type | Amount (parts by mass) |
| Example 1 | J-1 | A-1 | 100 | B-1 | 6.19 | C-1 | 5.25 | D-1 | 5 | S-1/S-2/S-3 | 2264/566/100 |
| Example 2 | J-2 | A-2 | 100 | B-1 | 6.19 | C-1 | 5.25 | D-1 | 5 | S-1/S-2/S-3 | 2264/566/100 |
| Example 3 | J-3 | A-3 | 100 | B-1 | 6.19 | C-1 | 5.25 | D-1 | 5 | S-1/S-2/S-3 | 2264/566/100 |
| Example 4 | J-4 | A-4 | 100 | B-1 | 6.19 | C-1 | 5.25 | D-1 | 5 | S-1/S-2/S-3 | 2264/566/100 |
| Example 5 | J-5 | A-5 | 100 | B-1 | 6.19 | C-1 | 5.25 | D-1 | 5 | S-1/S-2/S-3 | 2264/566/100 |
| Example 6 | J-6 | A-6 | 100 | B-1 | 6.19 | C-1 | 5.25 | D-1 | 5 | S-1/S-2/S-3 | 2264/566/100 |
| Example 7 | J-7 | A-7 | 100 | B-1 | 6.19 | C-1 | 5.25 | D-1 | 5 | S-1/S-2/S-3 | 2264/566/100 |
| Example 8 | J-8 | A-3 | 100 | B-2 | 6.57 | C-1 | 5.7 | D-1 | 5 | S-1/S-2/S-3 | 2264/566/100 |
| Example 9 | J-9 | A-4 | 100 | B-4 | 12.7 | C-3 | 0.52 | D-1 | 5 | S-1/S-2/S-3 | 2264/566/100 |
| Example 10 | J-10 | A-4 | 100 | B-4 | 12.7 | C-4 | 0.39 | D-1 | 5 | S-1/S-2/S-3 | 2264/566/100 |
| Example 11 | J-11 | A-4 | 100 | B-2 | 6.57 | C-2 | 4.61 | D-1 | 5 | S-1/S-2/S-3 | 2264/566/100 |
| Example 12 | J-12 | A-1 | 100 | B-1 | 6.19 | C-1 | 5.25 | D-1 | 5 | S-1/S-2/S-3 | 2141/918/100 |
| Example 13 | J-13 | A-1 | 100 | B-1 | 6.19 | C-1 | 5.25 | D-1 | 5 | S-1/S-2/S-3 | 2409/268/100 |
| Example 14 | J-14 | A-1 | 100 | B-1 | 6.19 | C-1 | 5.25 | D-1 | 8 | S-1/S-2 | 2344/586 |
| Example 15 | J-15 | A-1 | 100 | B-1 | 6.19 | C-1 | 5.25 | D-1 | 3 | S-1/S-2/S-3 | 2319/258/200 |
| Comparative Example 1 | CJ-1 | A-1 | 100 | B-1 | 6.19 | C-1 | 5.25 | D-1 | 3 | S-1/S-4/S-3 | 1862/798/100 |
| Comparative Example 2 | CJ-2 | A-1 | 100 | B-1 | 6.19 | C-1 | 5.25 | D-1 | 3 | S-1/S-5/S-3 | 2040/874/100 |
| Comparative Example 3 | CJ-3 | A-1 | 100 | B-1 | 6.19 | C-1 | 5.25 | D-1 | 3 | S-1/S-6/S-3 | 1862/798/100 |
| Comparative Example 4 | CJ-4 | A-1 | 100 | B-1 | 6.19 | C-1 | 5.25 | D-1 | 3 | S-1/S-7/S-3 | 1862/798/100 |

-continued (C-4)

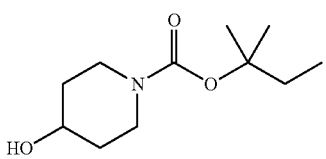

Formation of Resist Pattern

An underlayer antireflective film-forming composition ("ARC66" manufactured by Brewer Science) was applied to the surface of a 12-inch silicon wafer using a spin coater ("CLEAN TRACK ACT 12" manufactured by Tokyo Electron Ltd.), and baked at 205° C. for 60 seconds to form an underlayer antireflective film having a thickness of 105 nm. The resist composition was applied to the underlayer antireflective film using the spin coater, prebaked (PB) at 100° C. for 50 seconds, and cooled at 23° C. for 30 seconds to form a resist film having a thickness of 90 nm. The resist film was exposed through a 40 nm line-and-space (1L/1S) mask pattern using an ArF immersion scanner ("TWINSCAN XT-1900i" manufactured by ASML) (NA=1.35, Dipole 35X (σ=0.97/0.77)). The exposed resist film was subjected to PEB for 50 seconds at the temperature shown in Table 3. The resist film was then subjected to puddle development at 23° C. for 30 seconds using a 2.38 mass % TMAH aqueous solution, rinsed with ultrapure water for 7 seconds, and spin-dried at 2000 rpm for 15 seconds to form a 40 nm line-and-space (1L/1S) resist pattern.

Evaluation

The resist composition was evaluated as described below by performing measurement using the resist pattern that was formed as described above. The measurement was performed using a scanning electron microscope ("CG-4000" manufactured by Hitachi High-Technologies Corporation). The evaluation results are shown in Table 3.

Sensitivity

An optimum dose (Eop) at which a 40 nm line-and-space resist pattern was formed (see above) was taken as the sensitivity (mJ/cm$^2$). A case where the sensitivity was 40 mJ/cm$^2$ or less was evaluated as "Acceptable", and a case where the sensitivity was more than 40 mJ/cm$^2$ was evaluated as "Unacceptable".

LWR Performance

The resist pattern formed at the optimum dose (Eop) was observed from above using the scanning electron microscope. The line width of the resist pattern was measured at an arbitrary 500 points, and the 3σ value was calculated from the distribution of the measured values, and taken as the LWR performance (nm). A small LWR value indicates that a variation in line width is small. A case where the LWR performance was 3.2 nm or less was evaluated as "Acceptable", and a case where the LWR performance was more than 3.2 nm was evaluated as "Unacceptable".

CDU Performance

The entire resist film was exposed at the optimum dose (Eop) through a mask pattern for forming a 40 nm line-and-space resist pattern, and subjected to PEB and development under the above conditions. The final dimensions of the resist film were measured at 102 points by observing the resist film from above using the scanning electron microscope, and the 3σ value was calculated from the distribution of the measured values, and taken as the CDU performance (nm). A small CDU value indicates that an in-plane variation in final dimensions of each cell is small. A case where the CDU performance was 1.5 nm or less was evaluated as "Acceptable", and a case where the CDU performance was more than 1.5 nm was evaluated as "Unacceptable".

Defect Suppression Capability

The entire resist film was exposed at the optimum dose (Eop) through a mask pattern for forming a 40 nm line-and-space resist pattern, and subjected to PEB and development under the above conditions. The number of pattern defects was measured using a defect inspection device ("2810" manufactured by KLA-Tencor). A case where the number of defects was 1 or less per cm$^2$ was evaluated as "Acceptable", and a case where the number of defects was more than 1 per cm$^2$ was evaluated as "Unacceptable".

Applicability (Applicability to Silicon Film)

The resist composition was automatically applied to a silicon film using a coater/developer ("CLEAN TRACK LITHIUS Pro-i" manufactured by Tokyo Electron Ltd.) to evaluate the applicability of the resist composition. A case where halation, peeling, repelling, and the like were not observed was evaluated as "Acceptable", and a case where at least one of halation, peeling, repelling, and the like was observed was evaluated as "Unacceptable".

Applicability (Minimum Necessary Application Amount)

A case where no abnormalities were observed when the resist composition was automatically applied in an amount of 0.5 mL or less using the coater/developer was evaluated as "Acceptable", and a case where abnormalities were observed when the resist composition was automatically applied in an amount of 0.5 mL or less using the coater/developer was evaluated as "Unacceptable".

Storage Stability (Foreign Substance)

The resist composition was stored at room temperature in air, and the number of foreign substances having a size of 0.2 μm or less was regularly measured using a particle counter ("KE-40" manufactured by Rion Co., Ltd.). It is desirable that the number of foreign substances having a size of 0.2 μm or less be 10 or less per mL. A case where the number of foreign substances having a size of 0.2 μm or less was 10 or less per mL over 6 months was evaluated as "Acceptable", and a case where the number of foreign substances having a size of 0.2 μm or less exceeded 10 per mL within 6 months was evaluated as "Unacceptable".

Storage Stability (Sensitivity)

The resist composition was stored at room temperature in air in a sealed state, and the sensitivity was regularly measured using the above method. It is desirable that a change in sensitivity be within 1% with respect to the sensitivity measured immediately after preparation. A case where a change in sensitivity was within 1% with respect to the sensitivity measured immediately after preparation over 6 months was evaluated as "Acceptable", and a case where a change in sensitivity exceeded 1% with respect to the sensitivity measured immediately after preparation within 6 months was evaluated as "Unacceptable".

TABLE 3

| | Photoresist composition | PEB temp. (° C.) | Eop (mJ/cm$^2$) | LWR performance (nm) | CDU performance (nm) | Applicability to silicon film | Minimum necessary application amount | Defects | Storage stability (foreign substance) | Storage stability (sensitivity) |
|---|---|---|---|---|---|---|---|---|---|---|
| Example 1 | J-1 | 110 | 27.9 | 2.3 | 1.2 | Acceptable | Acceptable | Acceptable | Acceptable | Acceptable |
| Example 2 | J-2 | 100 | 29.1 | 2.8 | 1.2 | Acceptable | Acceptable | Acceptable | Acceptable | Acceptable |
| Example 3 | J-3 | 85 | 33.0 | 2.4 | 1.2 | Acceptable | Acceptable | Acceptable | Acceptable | Acceptable |
| Example 4 | J-4 | 100 | 29.5 | 2.3 | 1.1 | Acceptable | Acceptable | Acceptable | Acceptable | Acceptable |
| Example 5 | J-5 | 90 | 29.0 | 2.3 | 1.2 | Acceptable | Acceptable | Acceptable | Acceptable | Acceptable |
| Example 6 | J-6 | 95 | 27.0 | 2.2 | 1.2 | Acceptable | Acceptable | Acceptable | Acceptable | Acceptable |
| Example 7 | J-7 | 95 | 24.0 | 2.2 | 1.1 | Acceptable | Acceptable | Acceptable | Acceptable | Acceptable |
| Example 8 | J-8 | 85 | 25.5 | 2.4 | 1.3 | Acceptable | Acceptable | Acceptable | Acceptable | Acceptable |
| Example 9 | J-9 | 100 | 27.8 | 3.1 | 1.3 | Acceptable | Acceptable | Acceptable | Acceptable | Acceptable |
| Example 10 | J-10 | 100 | 28.0 | 3.0 | 1.2 | Acceptable | Acceptable | Acceptable | Acceptable | Acceptable |
| Example 11 | J-11 | 100 | 27.7 | 2.5 | 1.2 | Acceptable | Acceptable | Acceptable | Acceptable | Acceptable |

TABLE 3-continued

|  | Photoresist composition | PEB temp. (° C.) | Eop (mJ/cm²) | LWR performance (nm) | CDU performance (nm) | Applicability to silicon film | Minimum necessary application amount | Defects | Storage stability (foreign substance) | Storage stability (sensitivity) |
|---|---|---|---|---|---|---|---|---|---|---|
| Example 12 | J-12 | 110 | 29.9 | 2.3 | 1.1 | Acceptable | Acceptable | Acceptable | Acceptable | Acceptable |
| Example 13 | J-13 | 110 | 29.1 | 2.3 | 1.2 | Acceptable | Acceptable | Acceptable | Acceptable | Acceptable |
| Example 14 | J-14 | 110 | 29.5 | 2.3 | 1.3 | Acceptable | Acceptable | Acceptable | Acceptable | Acceptable |
| Example 15 | J-15 | 110 | 27.6 | 2.3 | 1.1 | Acceptable | Acceptable | Acceptable | Acceptable | Acceptable |
| Comparative Example 1 | CJ-1 | 110 | 27.7 | 2.4 | 2.2 | Acceptable | Unacceptable | Acceptable | Acceptable | Acceptable |
| Comparative Example 2 | CJ-2 | 110 | 27.1 | 2.4 | 1.3 | Repelling occurred | Acceptable | Acceptable | The standard was exceeded in the second week | The standard was exceeded in the first week |
| Comparative Example 3 | CJ-3 | 110 | 27.3 | 2.6 | 2.0 | Acceptable | Unacceptable | Unacceptable | The standard was exceeded in the fourth week | Acceptable |
| Comparative Example 4 | CJ-4 | 110 | 27.5 | 2.3 | 3.1 | Acceptable | Unacceptable | Unacceptable | The standard was exceeded in the first week | The standard was exceeded in the first week |

As is clear from the results shown in Table 3, the resist compositions of Examples 1 to 15 exhibited excellent LWR performance, excellent CDU performance, an excellent defect suppression capability, excellent applicability, and excellent storage stability. In contrast, the resist compositions of Comparative Examples 1 to 4 could not satisfy all of these performances at the same time. In particular, the resist compositions of Comparative Examples 1 to 4 exhibited poor applicability and poor storage stability.

The resist composition and the resist pattern-forming method according to the embodiments of the invention can form a resist pattern that exhibits excellent applicability, excellent storage stability, excellent LWR performance, excellent CDU performance, and an excellent defect suppression capability. A resist composition that includes the resist solvent according to the embodiments of the invention exhibits improved LWR performance, CDU performance, defect suppression capability, applicability, and storage stability. Therefore, the resist composition, the resist pattern-forming method, and the resist solvent may suitably be used for the production of semiconductor devices that are expected to be further miniaturized in the future.

Obviously, numerous modifications and variations of the invention are possible in light of the above teachings. It is therefore to be understood that within the scope of the appended claims, the invention may be practiced otherwise than as specifically described herein.

What is claimed is:

1. A resist composition comprising:
    a polymer that comprises:
        an acid-labile group-containing structural unit; and
        a structural unit that comprises a lactone structure, a cyclic carbonate structure, a sultone structure, or a combination thereof,
    a photoacid generator; and
    a solvent comprising:
        a compound comprising a ketonic carbonyl group and an alcoholic hydroxyl group; and
        an alkylene glycol monoalkyl ether carboxylate, a content of the compound in the solvent being from 7 mass % to 35 mass %.

2. The resist composition according to claim 1, wherein the alcoholic hydroxyl group is a tertiary alcoholic hydroxyl group.

3. The resist composition according to claim 1, wherein the compound is an aliphatic ketoalcohol having 4 to 10 carbon atoms.

4. The resist composition according to claim 1, wherein the compound is an aliphatic ketoalcohol having 6 to 10 carbon atoms, the aliphatic ketoalcohol comprising a tertiary alcoholic hydroxyl group at the β-position with respect to the ketonic carbonyl group.

5. The resist composition according to claim 1, wherein the solvent further comprises a lactone compound.

6. The resist composition according to claim 1, wherein the resist composition further comprises a fluorine atom-containing polymer which is other than the polymer.

7. A resist pattern-forming method comprising:
    forming a resist film using the resist composition according to claim 1;
    exposing the resist film; and
    developing the exposed resist film.

* * * * *